US012660436B2

(12) United States Patent
Park et al.

(10) Patent No.: US 12,660,436 B2
(45) Date of Patent: Jun. 16, 2026

(54) LIGHT EMITTING DISPLAY DEVICE AND METHOD FOR MANUFACTURING THE SAME

(71) Applicant: Samsung Display Co., LTD., Yongin-si (KR)

(72) Inventors: Beom Soo Park, Seongnam-si (KR); Seung Chan Lee, Hwaseong-si (KR); Wang Jo Lee, Suwon-si (KR); Donghee Choi, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 837 days.

(21) Appl. No.: 17/878,147

(22) Filed: Aug. 1, 2022

(65) Prior Publication Data

US 2023/0209923 A1     Jun. 29, 2023

(30) Foreign Application Priority Data

Dec. 28, 2021     (KR) ........................ 10-2021-0189590

(51) Int. Cl.
H10K 71/00 (2023.01)
H10K 59/122 (2023.01)
H10K 59/131 (2023.01)
H10K 59/12 (2023.01)

(52) U.S. Cl.
CPC ......... H10K 59/131 (2023.02); H10K 59/122 (2023.02); H10K 71/00 (2023.02); *H10K 59/1201* (2023.02)

(58) Field of Classification Search
CPC ......... H10K 2102/351; H10K 59/1201; H10K 59/122; H10K 59/124; H10K 59/131; H10K 59/1315; H10K 59/80521; H10K 71/00
See application file for complete search history.

(56) References Cited

U.S. PATENT DOCUMENTS

| | | | |
|---|---|---|---|
| 2010/0084638 A1 | 4/2010 | Hotta et al. | |
| 2014/0231764 A1* | 8/2014 | Park ..................... H10K 59/131 | 438/23 |
| 2017/0148865 A1* | 5/2017 | Cho ................. H10K 59/80522 | |
| 2018/0006106 A1* | 1/2018 | Oh ........................ H10K 50/828 | |
| 2018/0083221 A1 | 3/2018 | Kim et al. | |
| 2021/0005700 A1 | 1/2021 | Park et al. | |

FOREIGN PATENT DOCUMENTS

| | | |
|---|---|---|
| KR | 101400284 | 5/2014 |
| KR | 101463650 | 11/2014 |
| KR | 1020160101271 A | 8/2016 |
| KR | 1020190012789 | 2/2019 |
| KR | 1020210005452 A | 1/2021 |
| KR | 1020210043106 | 4/2021 |

* cited by examiner

*Primary Examiner* — Meiya Li
(74) *Attorney, Agent, or Firm* — CANTOR COLBURN LLP

(57) ABSTRACT

A light emitting display device includes: a substrate; a transistor disposed on the substrate; an anode connected to the transistor, an emission layer disposed on the anode; a common voltage line disposed on the substrate; and a cathode disposed on the emission layer and the common voltage line, where a thickness of a first portion of the cathode overlapping the emission layer is different from a thickness of a second portion of the cathode not overlapping the emission layer.

10 Claims, 31 Drawing Sheets

FIG. 27

LIGHT EMITTING DISPLAY DEVICE AND METHOD FOR MANUFACTURING THE SAME

This application claims priority to Korean Patent Application No. 10-2021-0189590, filed on Dec. 28, 2021, and all the benefits accruing therefrom under 35 U.S.C. § 119, the content of which in its entirety is herein incorporated by reference.

BACKGROUND

1. Field

The present disclosure relates to a light emitting display device and a manufacturing method thereof.

2. Description of the Related Art

A display device displays images on a screen, and includes a liquid crystal display (LCD) and an organic light emitting diode (OLED) display. The display device is used for various electronic devices such as a portable phone, a global positioning system (GPS), a digital camera, an electronic book, a portable game device, or various terminals.

An organic light emitting device includes two electrodes and an organic emission layer disposed therebetween, and electrons injected from one electrode are combined with holes injected from the other electrode on an organic emission layer to form excitons. The excitons transit to a ground state from an excited state to output energy and emit light.

The organic light emitting device includes a plurality of pixels including an organic light emitting diode that is a self-light-emitting device, and a plurality of transistors and at least one capacitor for driving the organic light emitting diode are formed on respective pixels. Wires for transmitting a common voltage may be connected to a cathode in a peripheral area of the display device to transmit the common voltage to a plurality of pixels.

SUMMARY

Recently, as a size of a display device increases, a voltage drop may in a common voltage line and such a voltage drop may be seen as stains.

The described technology has been made in an effort to provide a light emitting display device for preventing stains from being visible by preventing generation of a common voltage drop, and a method for manufacturing the light emitting display device.

An embodiment provides a light emitting display device including: a substrate; a transistor disposed on the substrate; an anode connected to the transistor; an emission layer disposed on the anode; a common voltage line disposed on the substrate; and a cathode disposed on the emission layer and the common voltage line, where a thickness of a first portion of the cathode overlapping the emission layer is different from a thickness of a second portion of the cathode not overlapping the emission layer.

In an embodiment, the thickness of the first portion of the cathode may be greater than the thickness of the second portion of the cathode.

In an embodiment, the light emitting display device may further include: a first organic film disposed on the common voltage line; and a cathode connecting member disposed on the first organic film and connected to the common voltage line, where the cathode connecting member may be connected between the common voltage line and the cathode.

In an embodiment, the light emitting display device may further include: a first anode connecting member connected to the transistor; and a second anode connecting member connected between the first anode connecting member and the anode, where the first organic film may be disposed between the first anode connecting member and the second anode connecting member.

In an embodiment, the common voltage line may be disposed in a same layer as the first anode connecting member, and the cathode connecting member may be disposed in a same layer as the second anode connecting member.

In an embodiment, the light emitting display device may further include: a second organic film disposed on the cathode connecting member; and a pixel defining layer disposed on the second organic film and the anode, where the anode may be disposed on the second organic film.

In an embodiment, an opening may be defined in the second organic film and the pixel defining layer to overlap the cathode connecting member, where the cathode may be connected to the cathode connecting member through the opening.

In an embodiment, the emission layer may not be disposed in the opening.

In an embodiment, the light emitting display device may further include a capping layer disposed on the cathode.

In an embodiment, the substrate may include a light transmitting region, and the emission layer and the cathode may not be disposed in the light transmitting region.

Another embodiment provides a method for manufacturing a light emitting display device, including: providing a transistor on a substrate; providing a common voltage line on the substrate; providing an organic film on the transistor and the common voltage line; forming a first opening in the organic film to overlap the transistor and forming a second opening in the organic film to overlap the common voltage line; providing an anode connected to the transistor in the first opening and on the organic film; providing a pixel defining layer on the anode and the organic film; forming a third opening in the pixel defining layer to overlap the anode, and forming a fourth opening in the pixel defining layer to overlap the second opening; providing a photoresist pattern in the fourth opening; providing an emission layer on the anode and the photoresist pattern; providing a portion of a cathode on the emission layer by performing a first cathode formation; removing the photoresist pattern; and forming another portion of the cathode on the portion of the cathode and the common voltage line by performing a second cathode formation.

In an embodiment, the photoresist pattern may have a reverse taper shape.

In an embodiment, the removing the photoresist pattern may include removing a portion of the emission layer disposed on the photoresist pattern and a portion of the cathode disposed on the photoresist pattern.

In an embodiment, a thickness of a first portion of the cathode overlapping the emission layer may be different from a thickness of a second portion of the cathode not overlapping the emission layer.

In an embodiment, the thickness of the first portion of the cathode may be greater than the thickness of the second portion of the cathode.

In an embodiment, the emission layer may not be disposed in the second opening and the fourth opening.

In an embodiment, the method may further include providing a temporary capping layer on the cathode after the first cathode formation, removing the temporary capping layer after the removing the photoresist pattern, and providing a capping layer on the cathode after the second cathode formation.

In an embodiment, the substrate may include a light transmitting region, the providing the photoresist pattern may include providing an auxiliary photoresist pattern in the light transmitting region, and the auxiliary photoresist pattern may have a reverse taper shape.

In an embodiment, the removing the photoresist pattern may include reducing a width of the auxiliary photoresist pattern.

In an embodiment, the method may further include removing the auxiliary photoresist pattern after the second cathode formation.

According to embodiments, generation of the common voltage drop in a predetermined region of the light emitting display device may be effectively prevented, and the stains are effectively prevented from being visible.

BRIEF DESCRIPTION OF THE DRAWINGS

FIG. 25 to FIG. 31 show cross-sectional views of cross-sectional shapes in processes of manufacturing a light emitting display device according to an embodiment.

DETAILED DESCRIPTION

Figure 1:
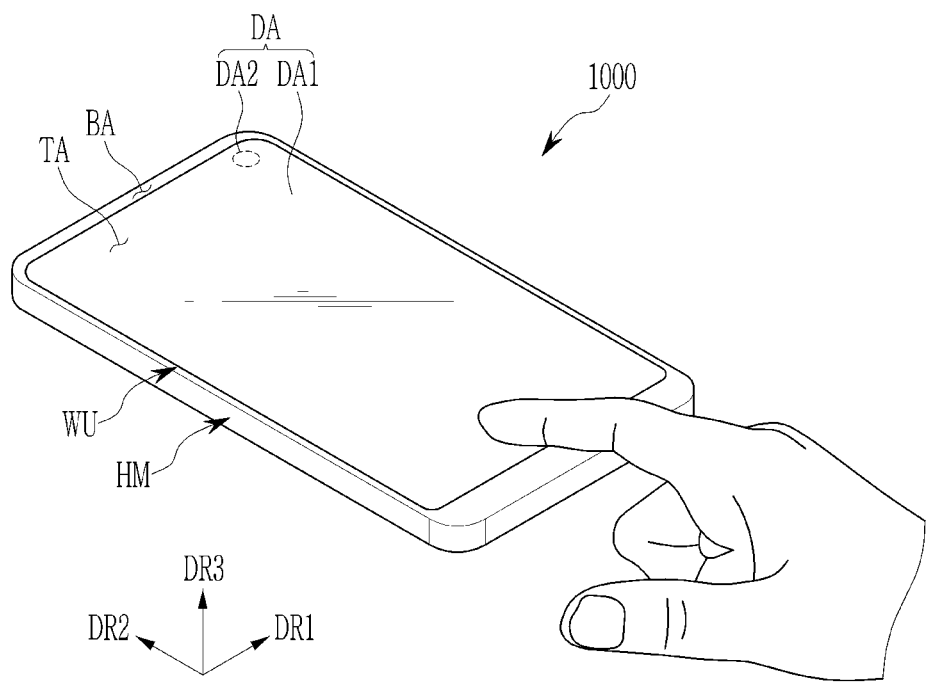
FIG. 1 shows a perspective view on a using state of a display device according to an embodiment.

The invention will be described more fully hereinafter with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The size and thickness of each configuration shown in the drawings are arbitrarily shown for better understanding and ease of description, but the invention is not limited thereto. In the drawings, the thickness of layers, films, panels, regions, etc., are enlarged for clarity. The thicknesses of some layers and areas are exaggerated for convenience of illustration.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

The phrase "on a plane" means viewing the object portion from the top, and the phrase "on a cross-section" means viewing a cross-section of which the object portion is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A structure of a light emitting display device according to an embodiment will now be described with reference to FIG. 1 to FIG. 3.

Figure 2:
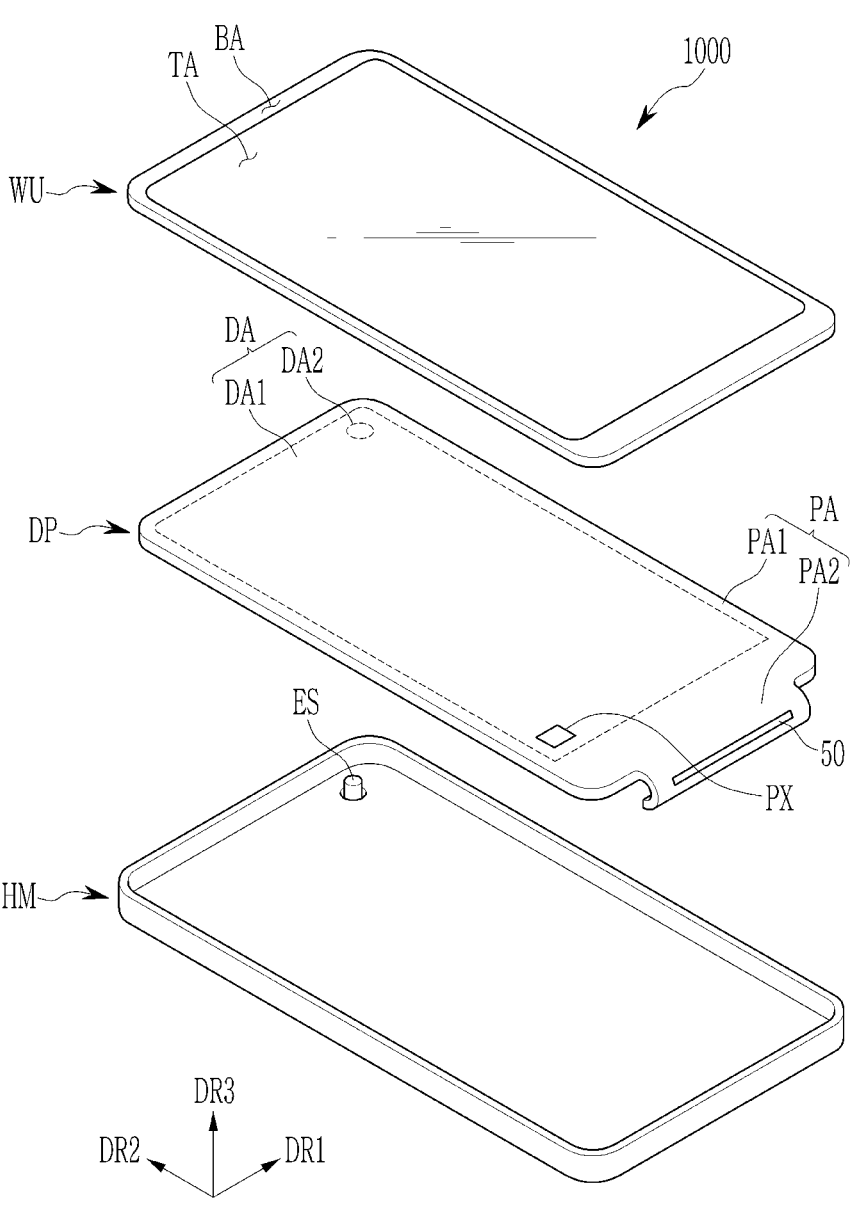
FIG. 2 shows an exploded perspective view of a display device according to an embodiment.
Figure 3:
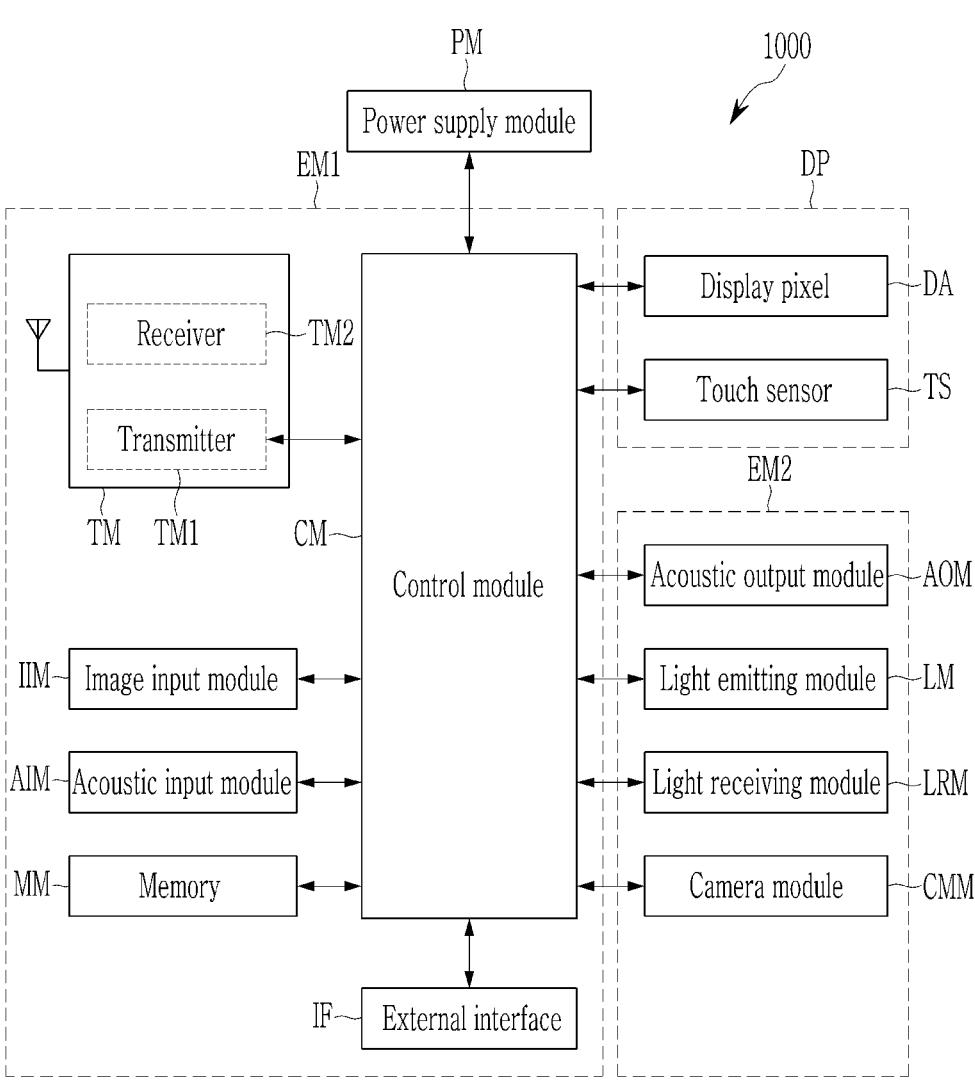
FIG. 3 shows a block diagram of a display device according to an embodiment.

FIG. 1 shows a perspective view of a using state of a display device according to an embodiment, FIG. 2 shows an exploded perspective view of a display device according to an embodiment, and FIG. 3 shows a block diagram of a display device according to an embodiment.

In an embodiment, the display device may be light emitting display device 1000. The light emitting display device 1000 represents a device for displaying videos or still images, and the light emitting display device 1000 may be used as a display screen for portable electronic devices such as mobile phones, smartphones, tablet personal computers (PC), mobile communication terminals, electronic organizers, electronic books, portable multimedia players (PMP), global positioning systems, or ultra mobile PCs (UMPC), and also for various products such as televisions, laptops, monitors, advertisement boards, or internet of things (IOT). The light emitting display device 1000 may also be used for wearable devices such as smart watches, watch phones, glasses-type displays, or head mounted displays (HMD). The light emitting display device 1000 may be used as a dashboard of a vehicle, a center information display (CID) disposed on a center fascia or a dashboard of a vehicle, a room mirror display replacing a side-view mirror of a vehicle, and a display disposed on a rear side of a front seat for entertainment for a back seat of a vehicle. FIG. 1 shows an embodiment where the light emitting display device 1000 is used as a smartphone, for better comprehension and ease of description.

Referring to FIG. 1, FIG. 2, and FIG. 3, in an embodiment, the light emitting display device 1000 may display images in a third direction DR3 from a displaying side in parallel to a first direction DR1 and a second direction DR2. A displaying side on which images are displayed may correspond to a front surface of the light emitting display device 1000, and may correspond to the front surface of the cover window WU. The images may include videos and still images.

In embodiments of the invention, front surfaces and bottom surfaces of respective members may be defined with respect to the image displaying direction. The front surface and the bottom surface oppose each other in the third direction DR3, and normal directions of the respective front surface and the bottom surface may be parallel to the third direction DR3. A spaced distance between the front surface and the bottom surface in the third direction DR3 may correspond to the thickness of the light emitting display panel DP in the third direction DR3.

The light emitting display device 1000 may sense an input (refer to a hand of FIG. 1) of a user applied from an outside. The user input may include various types of external inputs such as some of a human body of the user, light, heat, or pressure. In an embodiment, as shown in FIG. 1, the user input may be a touch by a hand or finger of the user applied to the front surface. The invention is not limited thereto. The user input may be provided in various forms, and the light emitting display device 1000 may sense the user input applied to the lateral side or the bottom surface of the light emitting display device 1000 according to the structure of the light emitting display device 1000.

The display area DA may be divided into a first display area DA1 and a second display area DA2, and the second display area DA2 may include a light transmitting region and may additionally include a pixel for displaying images. The second display area DA2 may at least partly overlap an optical element ES such as a camera or a photosensor. FIG. 1 shows an embodiment where the second display area DA2 is disposed in a circular shape at a top right end of the light emitting display device 1000, but the invention is not limited thereto. Alternatively, the second display area DA2 may be provided with various numbers and shapes according to the number and the shape of the optical element ES.

The light emitting display device 1000 may receive an external signal for the optical element ES through the second display area DA2 or may provide a signal output by the optical element ES to the outside. The second display area DA2 overlaps the light transmitting region such that an area of the blocking area BA for forming a light transmitting region may be reduced. The blocking area BA has relatively lower light transmittance than the transmission area TA and may include a bezel region.

The light emitting display device 1000 may include a cover window WU, a housing HM, a light emitting display panel DP, and an optical element ES. The cover window WU may be combined to the housing HM to configure an exterior of the light emitting display device 1000.

The cover window WU may include an insulation panel. In an embodiment, for example, the cover window WU may include or be made of glass, plastic, or a combination thereof.

The front surface of the cover window WU may define the front surface of the light emitting display device 1000. The transmission area TA may be an optically transparent region. In an embodiment, for example, the transmission area TA may have visible ray transmittance of equal to or greater than about 90%.

The blocking area BA may define a shape of the transmission area TA. The blocking area BA may be disposed near the transmission area TA and may surround the transmission area TA. The blocking area BA may have relatively lower light transmittance than the transmission area TA. The blocking area BA may include an opaque material for blocking light. The blocking area BA may have a predetermined color. The blocking area BA may be defined by a bezel layer provided in addition to a transparent substrate for defining the transmission area TA, or may be defined by an ink layer inserted into or colored to the transparent substrate.

The light emitting display panel DP may include a plurality of pixels PX for displaying images, a touch sensor TS for sensing external inputs, and a driver 50. The light emitting display panel DP may include a display area DA and a non-display area PA. The display area DA allows the pixel to be operable by electrical signals and emit light.

The display area DA includes pixels and displays images, a touch sensor TS is positioned on an upper side of the display area DA in the third direction DR3 of the pixel, and the display area DA thus senses external inputs.

The transmission area TA of the cover window WU may at least partly overlap the display area DA of the light emitting display panel DP. In an embodiment, for example, the transmission area TA may overlap the entire side of the display area DA or may overlap at least part of the display area DA. In such an embodiment, the user may see the images through the transmission area TA or may provide external inputs based on the images. However, the invention is not limited thereto. In an alternative embodiment, for example, the region in which images are displayed may be separated from the region from which external inputs are sensed in the display area DA.

The non-display area PA of the light emitting display panel DP may at least partly overlap the blocking area BA of the cover window WU. The non-display area PA may be covered by the blocking area BA. The non-display area PA may be disposed near the display area DA, and may surround the display area DA. The non-display area PA displays no images, and a driving circuit for driving the display area DA or driving wires may be disposed therein. The non-display area PA may include a first peripheral area PA1 positioned on an outside of the display area DA, and a second peripheral area PA2 including a driver 50, a connection wire, and a bending region. In an embodiment described with reference to FIG. 2, the first peripheral area PA1 is positioned on one side of the display area DA, and the second peripheral area PA2 is positioned in another side of the display area DA.

The light emitting display panel DP may be assembled in a flat state so that the display area DA and the non-display area PA may face the cover window WU. However, the invention is not limited thereto. A predetermined portion of the non-display area PA of the light emitting display panel DP may be bent. In such an embodiment, tart of the non-display area PA faces the bottom surface of the light emitting display device 1000 such that the blocking area BA seen on the front surface of the light emitting display device 1000 may be reduced, and as shown in FIG. 2, the second peripheral area PA2 may be bent to be positioned on the bottom surface of the display area DA and be assembled.

The display area DA may include a first display area DA1 and a second display area DA2. The second display area DA2 may include a light transmitting region and may have relatively greater light transmittance than the first display area DA1. The second display area DA2 may have relatively less area than the first display area DA1. The second display area DA2 may be defined to be a region that overlaps the region in which the optical element ES is disposed in the housing HM from among the light emitting display panel DP. In an embodiment, as shown in FIG. 2, the second display area DA2 may have a circular shape, but the invention is not limited thereto. Alternatively, the second display area DA2 may have various shapes such as a polygon, an oval, or a figure with at least one curved line.

The first display area DA1 may be disposed near the second display area DA2. The first display area DA1 may surround the entire second display area DA2. However, the invention is not limited thereto. The first display area DA1 may partly surround the second display area DA2.

Referring to FIG. 3, the light emitting display panel DP may include a display area DA including display pixels, and a touch sensor TS. The light emitting display panel DP may include pixels configuring images and may be seen by the user through the transmission area TA. The touch sensor TS may be positioned on the upper portion of the pixel and may sense the external inputs applied from the outside. The touch sensor TS may sense the external inputs provided to the cover window WU.

Referring to FIG. 2, the second peripheral area PA2 may include a bending portion. The display area DA and the first peripheral area PA1 may have a planar state substantially in parallel to a plane defined by the first direction DR1 and the second direction DR2, and one side of the second peripheral area PA2 may extend from the planar state, may pass through the bending portion, and may then have the planar state. As a result, at least part of the second peripheral area PA2 may be bent and may be assembled to be disposed on the bottom surface of the display area DA. When the at least part of the second peripheral area PA2 is bent to be assembled, the second peripheral area PA2 partially overlaps the display area DA in a plan view such that the blocking area BA of the light emitting display device 1000 may be reduced. However, the invention is not limited thereto. In an alternative embodiment, for example, the second peripheral area PA2 may not be bent.

The driver 50 may be installed in the second peripheral area PA2, and may be positioned on the bending portion or one of respective sides of the bending portion. The driver 50 may be provided in a chip form.

The driver 50 may be electrically connected to the display area DA and may transmit electrical signals to the display area DA. In an embodiment, for example, the driver 50 may provide data signals to the pixels PX disposed in the display area DA. In an alternative embodiment, the driver 50 may include a touch driving circuit, and may be electrically connected to the touch sensor TS disposed in the display area DA. The driver 50 may be designed to include various types of circuits in addition to the above-described circuits or provide various electrical signals to the display area DA.

A pad portion may be positioned at the end portion of the second peripheral area PA2, and the light emitting display device 1000 may be electrically connected to a flexible printed circuit board (FPCB) including a driving chip by the pad portion. The driving chip positioned on the FPCB may include various types of driving circuits for driving the light emitting display device 1000 or a connector for supplying a power voltage. In an alternative embodiment, a rigid printed circuit board (PCB) may be used instead of the FPCB.

The optical element ES may be disposed on a lower portion of the light emitting display panel DP. The optical element ES may receive external inputs through the second display area DA2 or may output signals through the second display area DA2. As the second display area DA2 with relatively greater transmittance is installed in the display area DA, the optical element ES may overlap the display area DA, thereby reducing the area (or size) of the blocking area BA.

Referring to FIG. 3, an embodiment of the light emitting display device 1000 may include a light emitting display panel DP, a power supply module PM, a first electronic module EM1, and a second electronic module EM2. The light emitting display panel DP, the power supply module PM, the first electronic module EM1, and the second electronic module EM2 may be electrically connected to each other. FIG. 3 shows only a display pixel in the display area DA and a touch sensor TS from among the configuration of the light emitting display panel DP, for convenience of illustration.

The power supply module PM may supply a power voltage for a general operation of the light emitting display device 1000. The power supply module PM may include a conventional battery module.

The first electronic module EM1 and the second electronic module EM2 may include various types of functional modules for operating the light emitting display device 1000. The first electronic module EM1 may be mounted on a motherboard electrically connected to the light emitting display panel DP, or may be mounted on and additional substrate and may then be electrically connected to the motherboard through a connector (not shown).

The first electronic module EM1 may include a control module CM, a radio communication module TM, an image input module IIM, an acoustic input module AIM, a memory MM, and an external interface IF. Some of the modules may not be mounted on the motherboard, and may be electrically connected to the motherboard through a FPCB connected thereto.

The control module CM may control the general operation of the light emitting display device 1000. The control module CM may be a microprocessor. In an embodiment, for example, the control module CM may activate/deactivate the light emitting display panel DP. The control module CM may control other modules such as the image input module IIM or the acoustic input module AIM based on the touch signal received from the light emitting display panel DP.

The radio communication module TM may transmit/receive radio signals to/from other terminals by using Bluetooth or Wi-Fi lines. The radio communication module TM may transmit/receive voice signals by using a general communication line. The radio communication module TM includes a transmitter TM1 for modulating signals and transmitting the signals, and a receiver TM2 for demodulating the received signals.

The image input module IIM may process image signals and may convert the processed image signals into image data displayable on the light emitting display panel DP. The acoustic input module AIM may receive external acoustic signals by the microphone in a recording mode or a voice recognition mode, and may convert the received external acoustic signals into electrical voice data.

The external interface IF may function as an interface connected to an external charger, a cord/cordless data port, or a card socket (e.g., a memory card or a SIM/UIM card).

The second electronic module EM2 may include an acoustic output module AOM, a light emitting module LM, a light receiving module LRM, and a camera module CMM, and at least some thereof may be positioned as optical elements ES on the bottom surface of the display area DA as shown in FIG. 1 and FIG. 2. In an embodiment, the optical element ES may include a light emitting module LM, a light receiving module LRM, and a camera module CMM. The second electronic module EM2 may be mounted on the motherboard, may be mounted on an additional substrate and be electrically connected to the light emitting display panel DP through a connector (not shown), or may be electrically connected to the first electronic module EM1.

The acoustic output module AOM may convert the acoustic data received from the radio communication module TM or the acoustic data stored in the memory MM and may output the converted data.

The light emitting module LM may generate light and may output the light. The light emitting module LM may output infrared rays. In an embodiment, for example, the light emitting module LM may include an light emitting diode (LED) element. In an embodiment, for example, the light receiving module LRM may sense the infrared rays. The light receiving module LRM may be activated when the infrared rays with equal to or greater than a predetermined level are sensed. The light receiving module LRM may include a complementary metal-oxide semiconductor (CMOS) sensor. When the infrared rays generated by the light emitting module LM are output, the output infrared rays may be reflected on an external subject (e.g., a finger or a face of the user), and the reflected infrared rays may be input to the light receiving module LRM. The camera module CMM may photograph external images.

The optical element ES may additionally include a photosensor or a thermal sensor. The optical element ES may sense the external subject received through the front surface or may provide sound signals such as a voice to the outside through the front surface. The optical element ES may include a plurality of constitutional elements, and is not limited to one embodiment.

Referring back to FIG. 2, the housing HM may be combined to the cover window WU. The cover window WU may be disposed on the upper portion of the housing HM. The housing HM may be combined to the cover window WU and may provide a predetermined receiving space. The light emitting display panel DP and the optical element ES may be received in a predetermined receiving space provided between the housing HM and the cover window WU.

The housing HM may include a material with relatively great rigidity. In an embodiment, for example, the housing HM may include glass, plastic, or metal, or may include a plurality of frames and/or plates configured with a combination thereof. The housing HM may stably protect the constitutional elements of the light emitting display device 1000 received in an internal space from external impacts.

A structure of the light emitting display device 1000 according to an alternative embodiment will now be described with reference to FIG. 4.

Figure 4:
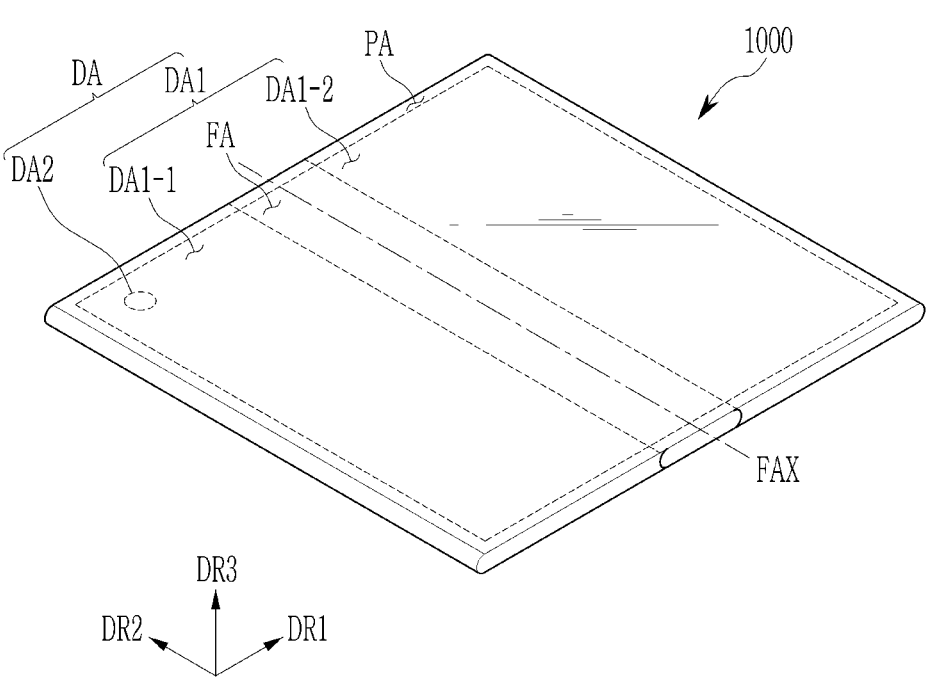
FIG. 4 shows a perspective view of a light emitting display device according to an embodiment.

FIG. 4 shows a perspective view of a light emitting display device according to an embodiment.

FIG. 4 shows an embodiment where the light emitting display device is a foldable light emitting display device having a structure in which the light emitting display device 1000 is folded with respect to a folding axis FAX.

In an embodiment of the foldable light emitting display device, the second display area DA2 may be positioned on an edge of one side, as shown in FIG. 4.

The optical element such as the camera or the optical sensor is positioned on the bottom surface of the second display area DA2 of FIG. 4, and the light transmitting region is positioned in the second display area DA2.

Referring to FIG. 4, in an embodiment, the light emitting display device 1000 may be a foldable light emitting display device. The light emitting display device 1000 may be folded to the inside or the outside with respect to the folding axis FAX. In an embodiment, where the light emitting display device 1000 is folded to the outside with respect to the folding axis FAX, the displaying side of the light emitting display device 1000 may be positioned on the outside in the third direction DR3, and the images may be displayed in the respective directions. In an embodiment where the light emitting display device 1000 is folded to the inside with respect to the folding axis FAX, the displaying side may not be seen from the outside.

The light emitting display device 1000 may include a housing, a light emitting display panel, and a cover window as described above.

The light emitting display panel may include a display area DA and a non-display area PA. The display area DA may display images and may sense external inputs. A plurality of pixels to be described may be disposed in the display area DA.

The display area DA may include a first display area DA1 and a second display area DA2. The first display area DA1 may be divided into a first first display area DA1-1, a second first display area DA1-2, and a folding area FA. The first first display area DA1-1 and the second first display area DA1-2 may be positioned on the left side and the right side with respect to the folding axis FAX, and the folding area FA may be positioned between the first first display area DA1-1 and the second first display area DA1-2. In an embodiment, where the light emitting display device 1000 is folded to the outside with respect to the folding axis FAX, the first first display area DA1-1 and the second first display area DA1-2 are positioned on respective sides in the third direction DR3 and may display the images in the respective directions. In an embodiment where the light emitting display device 1000 is folded to the inside with respect to the folding axis FAX, the first first display area DA1-1 and the second first display area DA1-2 may not be seen from the outside.

A structure of the pixel positioned on the lower panel layer of the light emitting display device DP, and a manufacturing method thereof, will now be described in detail with reference to FIG. 5 to FIG. 24. The structure of the pixel may a pixel structure of the first display area DA1 and/or the second display area DA2.

A circuit structure of the pixel will now be described with reference to FIG. 5.

Figure 5:
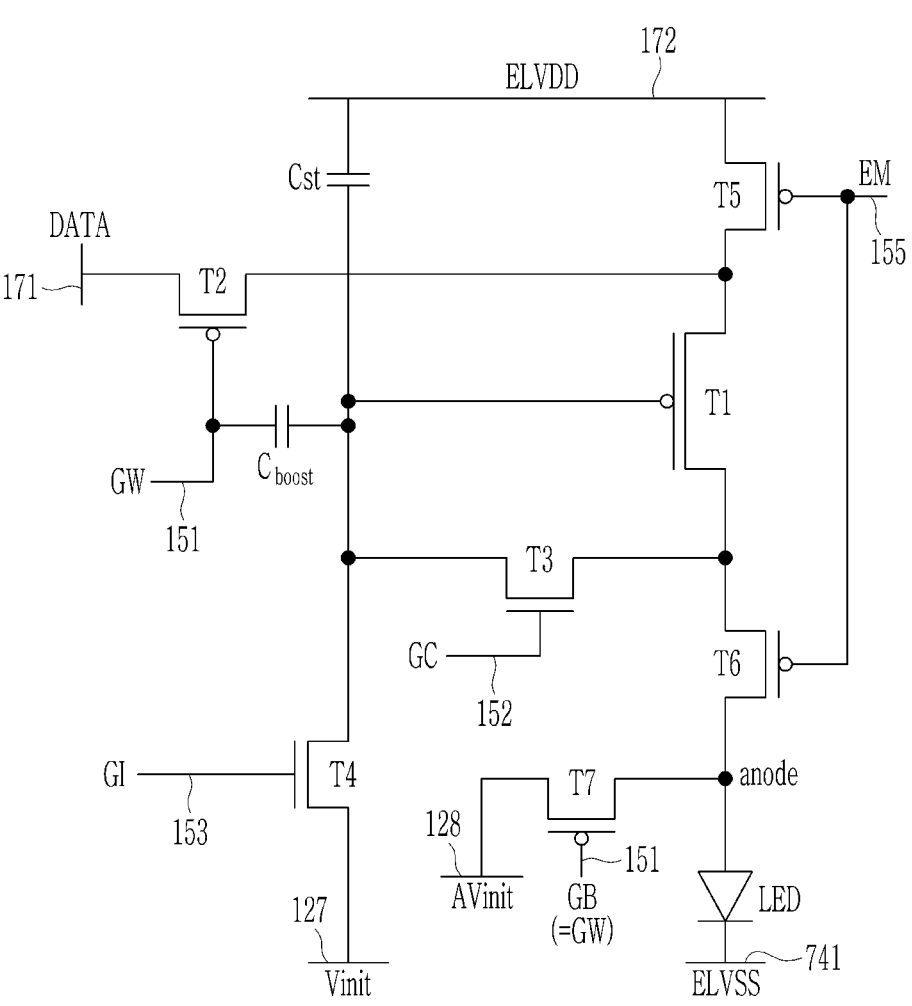
FIG. 5 shows a circuit diagram of one pixel included in a light emitting display device according to an embodiment.

FIG. 5 shows a circuit diagram of one pixel included in a light emitting display device according to an embodiment.

FIG. 5 represents a circuit structure of the pixel circuit unit and a light emitting diode LED disposed or formed in the first display area DA1 and the second display area DA2.

In an embodiment, a pixel includes a plurality of transistors T1, T2, T3, T4, T5, T6, and T7 connected to wires 127, 128, 151, 152, 153, 155, 171, 172, and 741, a storage capacitor Cst, a boost capacitor $C_{boost}$, and a light emitting diode LED. The transistors and the capacitor excluding the light emitting diode LED configure a pixel circuit unit. Alternatively, the boost capacitor $C_{boost}$ may be omitted.

The wires 127, 128, 151, 152, 153, 155, 171, 172, and 741 are connected to the pixel PX. The wires include a first initialization voltage line 127, a second initialization voltage line 128, a first scan line 151, a second scan line 152, an initialization control line 153, a light emitting control line 155, a data line 171, a driving voltage line 172, and a common voltage line 741. The first scan line 151 connected to the seventh transistor T7 is connected to the second transistor T2, and depending on embodiments, the seventh transistor T7 may, differing from the second transistor T2, be connected with a bypass control line.

The first scan line 151 is connected to a scan driver (not shown) and transmits a first scan signal GW to the second transistor T2 and the seventh transistor T7. The second scan line 152 may receive a voltage with an opposite polarity to the voltage applied to the first scan line 151 at a same timing as the signal of the first scan line 151. In an embodiment, for example, when a voltage with a negative polarity is applied to the first scan line 151, a voltage with a positive polarity may be applied to the second scan line 152. The second scan line 152 transmits a second scan signal GC to the third transistor T3. The initialization control line 153 transmits an initialization control signal GI to the fourth transistor T4. The light emitting control line 155 transmits a light emitting control signal EM to the fifth transistor T5 and the sixth transistor T6.

The data line 171 transmits a data voltage DATA generated by a data driver (not shown) such that an amount of the light emitting current transmitted to the light emitting diode LED is changed and luminance of light emitted by the light emitting diode LED is changed. The driving voltage line 172 applies a driving voltage ELVDD. The first initialization voltage line 127 transmits a first initialization voltage Vinit, and the second initialization voltage line 128 transmits a second initialization voltage AVinit. The common voltage line 741 applies a common voltage ELVSS to a cathode of the light emitting diode LED. Constant voltages may be applied to the driving voltage line 172, the first and second initialization voltage lines 127 and 128, and the common voltage line 741.

The driving transistor T1 (or a first transistor) is a p-type transistor, and has a silicon semiconductor as the semiconductor layer. The driving transistor T1 adjusts the amount of the light emitting current output to the anode of the light emitting diode LED based on an amount of the voltage (i.e., the voltage stored in the storage capacitor Cst) at a gate electrode of the driving transistor T1. As brightness of the light emitting diode LED is adjusted according to the size of the light emitting current output to the anode of the light emitting diode LED, light emitting luminance of the light emitting diode LED may be adjusted based on the data voltage DATA applied to the pixel. For this purpose, a first electrode of the driving transistor T1 is disposed to receive the driving voltage ELVDD through the fifth transistor T5 which is connected to the driving voltage line 172. The first electrode of the driving transistor T1 is also connected to a second electrode of the second transistor T2 and receives the data voltage DATA. A second electrode of the driving transistor T1 outputs a light emitting current to the light emitting diode LED through the sixth transistor T6 (or an output control transistor) which is connected to the anode of the light emitting diode LED. The second electrode of the driving transistor T1 is also connected to the third transistor T3, and transmits the data voltage DATA applied to the first electrode to the third transistor T3. The gate electrode of the driving transistor T1 is connected to one electrode (or a second storage electrode) of the storage capacitor Cst. The voltage at the gate electrode of the driving transistor T1 is changed based on the voltage stored in the storage capacitor Cst, and the light emitting current output by the driving transistor T1 is changed. The storage capacitor Cst maintains the voltage at the gate electrode of the driving transistor T1 for one frame. The gate electrode of the driving transistor T1 is also connected to the third transistor T3 so that the data voltage DATA applied to the first electrode of the driving transistor T1 may be transmitted to the gate electrode of the driving transistor T1 through the third transistor T3. The gate electrode of the driving transistor T1 may also be connected to the fourth transistor T4, may receive the first initialization voltage Vinit, and may be initialized.

The second transistor T2 is a p-type transistor, and has the silicon semiconductor as a semiconductor layer. The second transistor T2 allows the data voltage DATA to be received into the pixel. A gate electrode of the second transistor T2 is connected to the first scan line 151 and one electrode (or a lower portion boost electrode) of the boost capacitor $C_{boost}$. A first electrode of the second transistor T2 is connected to the data line 171. A second electrode of the second transistor T2 is connected to the first electrode of the driving transistor T1. When the second transistor T2 is turned on by the voltage with a negative polarity from among the first scan signal GW transmitted through the first scan line 151, the data voltage DATA transmitted through the data line 171 is transmitted to the first electrode of the driving transistor T1, and the data voltage DATA is finally transmitted to the gate electrode of the driving transistor T1 and is stored in the storage capacitor Cst.

The third transistor T3 is an n-type transistor, and has an oxide semiconductor as the semiconductor layer. The third transistor T3 electrically connects the second electrode of the driving transistor T1 and the gate electrode of the driving transistor T1 to each other. As a result, the third transistor T3 compensates the data voltage DATA by a threshold voltage of the driving transistor T1 and stores the compensated voltage in the second storage electrode of the storage capacitor Cst. The gate electrode of the third transistor T3 is connected to the second scan line 152, and the first electrode of the third transistor T3 is connected to the second electrode of the driving transistor T1. The second electrode of the third transistor T3 is connected to the second storage electrode of the storage capacitor Cst, the gate electrode of the driving transistor T1, and another electrode (or an upper boost electrode) of the boost capacitor $C_{boost}$. The third transistor T3 is turned on by the voltage with a positive polarity from among the second scan signal GC received through the second scan line 152, connects the gate electrode of the driving transistor T1 and the second electrode of the driving transistor T1 to each other, transmits the voltage applied to the gate electrode of the driving transistor T1 to the second storage electrode of the storage capacitor Cst, to be stored in the storage capacitor Cst. In this instance, the voltage is stored in the storage capacitor Cst by storing the voltage at the gate electrode of the driving transistor T1 when the driving transistor T1 is turned off and compensating a threshold voltage Vth value of the driving transistor T1.

The fourth transistor T4 is an n-type transistor, and has an oxide semiconductor as the semiconductor layer. The fourth transistor T4 initializes the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by the voltage with a positive polarity from among the initialization control signal GI received through the initialization control line 153, and transmits the first initialization voltage Vinit to the gate electrode of the driving transistor T1, the second storage electrode of the storage capacitor Cst, and the upper boost electrode of the boost capacitor $C_{boost}$ to be initialized.

The fifth transistor T5 and the sixth transistor T6 are p-type transistors, and have silicon semiconductors as the semiconductor layers.

The fifth transistor T5 transmits the driving voltage ELVDD to the driving transistor T1. A gate electrode of the fifth transistor T5 is connected to the light emitting control line 155, a first electrode of the fifth transistor T5 is connected to the driving voltage line 172, and a second electrode of the fifth transistor T5 is connected to the first electrode of the driving transistor T1.

The sixth transistor T6 transmits the light emitting current output by the driving transistor T1 to the light emitting diode LED. A gate electrode of the sixth transistor T6 is connected to the light emitting control line 155, a first electrode of the sixth transistor T6 is connected to the second electrode of the driving transistor T1, and a second electrode of the sixth transistor T6 is connected to the anode of the light emitting diode LED.

The seventh transistor T7 is a p-type or n-type transistor, and has a silicon semiconductor or an oxide semiconductor as the semiconductor layer. The seventh transistor T7 initializes the anode of the light emitting diode LED. A gate electrode of the seventh transistor T7 is connected to the first scan line 151, a first electrode of the seventh transistor T7 is connected to the anode of the light emitting diode LED, and a second electrode of the seventh transistor T7 is connected to the second initialization voltage line 128. When the seventh transistor T7 is turned on by the voltage with a negative polarity from among the first scan line 151, the second initialization voltage AVinit is applied to the anode of the light emitting diode LED and is initialized. In an embodiment, the gate electrode of the seventh transistor T7 may be connected to an additional bypass control line and may be controlled by a wire that is different from the first scan line 151. In an embodiment, the second initialization voltage line 128 to which the second initialization voltage AVinit is applied may correspond to the first initialization voltage line 127 to which the first initialization voltage Vinit is applied.

In an embodiment, a pixel PX may include seven transistors T1 to T7 and two capacitors (a storage capacitor Cst and a boost capacitor $C_{boost}$), as described above, but not being limited thereto. Alternatively, the boost capacitor $C_{boost}$ may be omitted. In an embodiment, the third transistor and the fourth transistor of the transistors in the pixel PX are n-type transistors, but not being limited thereto. Alternatively, one of the third transistor and the fourth transistor may be an n-type transistor or the other of the third transistor and the fourth transistor may be an n-type transistor.

The circuit structure of the pixel in the display area DA has been described with reference to FIG. 5.

A planar structure and a stacking structure of a pixel in a display area DA will now be described with reference to FIG. 6 to FIG. 24.

Planar structures of respective layers in manufacturing processes will now be described with reference to FIG. 6 to FIG. 18, and cross-sectional structures of respective layers in manufacturing processes will now be described with reference to FIG. 19 to FIG. 24. The shown pixel structure may be a pixel structure of the first display area DA1 and/or the second display area DA2.

FIG. 6 to FIG. 18 show top plan views of structures of respective layers in processes of manufacturing a lower panel layer in a light emitting display device according to an embodiment, and FIG. 19 to FIG. 24 show cross-section shapes in processes of manufacturing a lower panel layer in a light emitting display device according to an embodiment.

Figure 6:
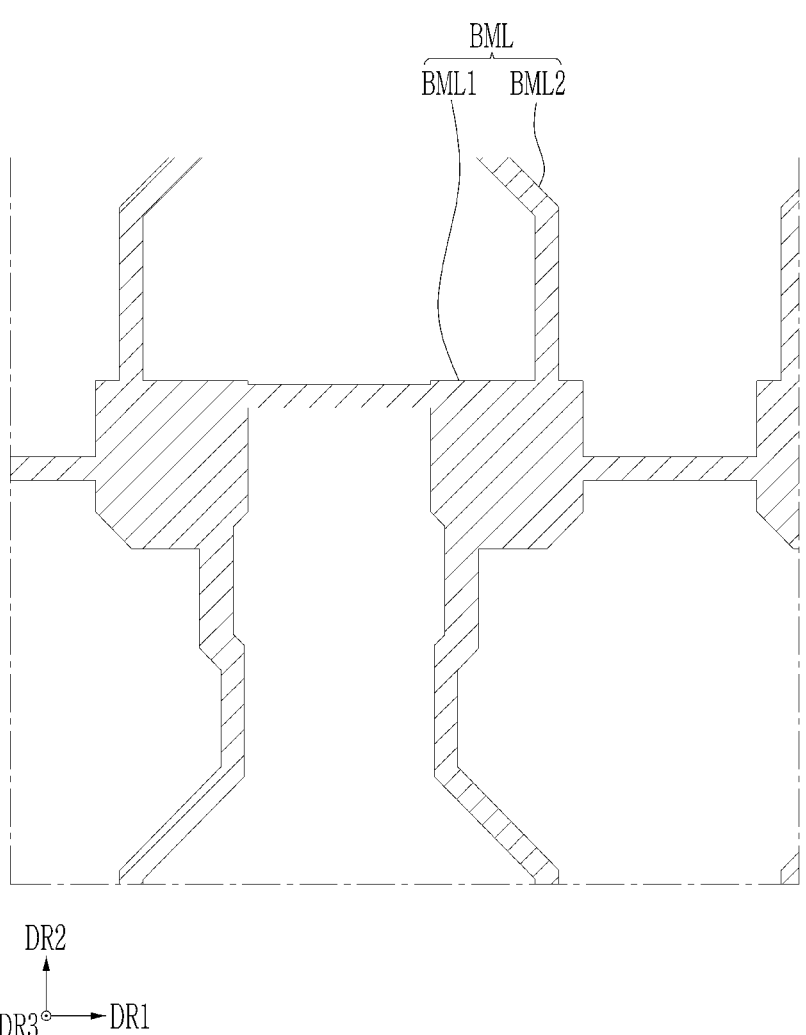
FIG. 6 to FIG. 18 show top plan views of structures of respective layers in processes of manufacturing a light emitting display device according to an embodiment.

Referring to FIG. 6, a metal layer BML is provided or formed on the substrate 110.

Figure 19:
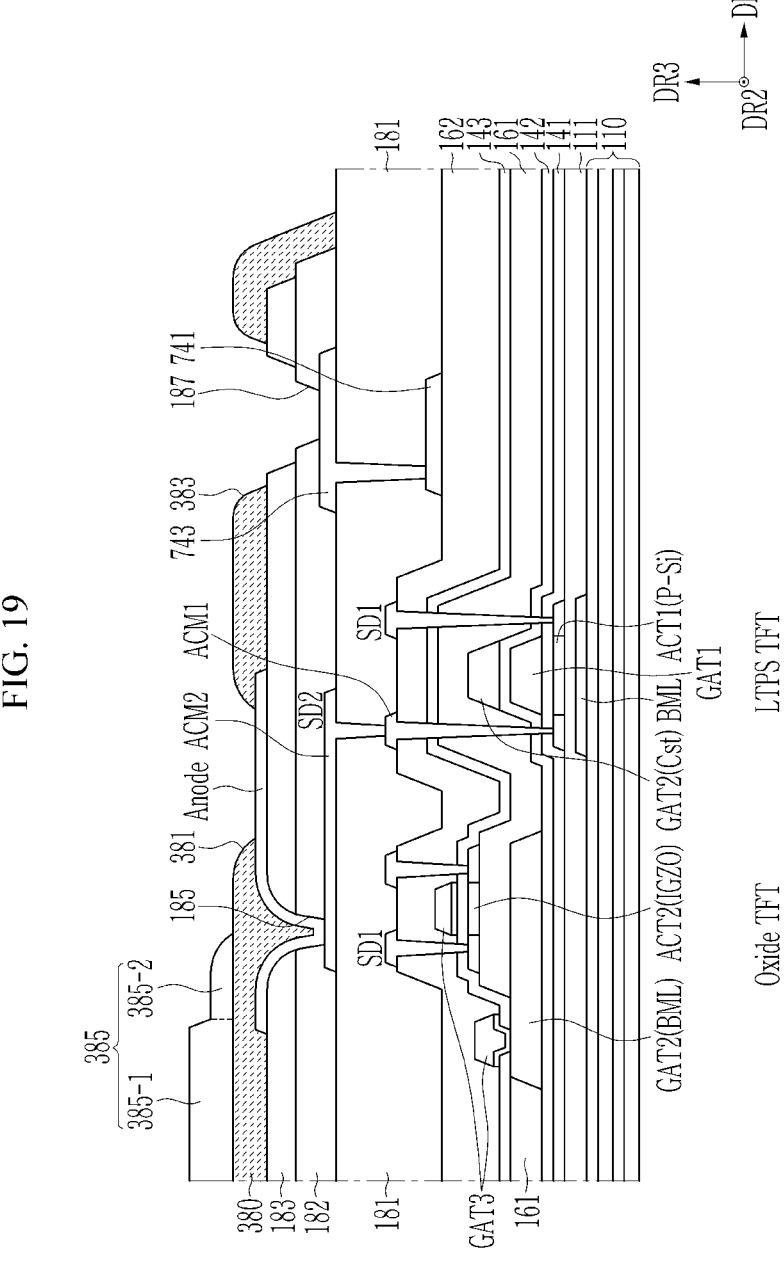
FIG. 19 to FIG. 24 show cross-sectional views of cross-sectional shapes in processes of manufacturing a light emitting display device according to an embodiment.

The substrate 110 may include a material that has a rigid characteristic and is resultantly not bent such as plastic or may include a flexible material that is bent such as a polyimide. As shown in FIG. 19, the flexible substrate may have a double-stacked structure in which each stack is defined by a polyimide and a barrier layer on the polyimide and including an inorganic insulating material.

The metal layer BML includes a plurality of extensions BML1 and a connector BML2 for connecting the extensions BML1 to each other. The extension BML1 of the metal layer BML may be provided or formed on a position overlapping the channel 1132 of the driving transistor T1 from among the first semiconductor layer in a plan view. The metal layer BML may also be referred to as a lower shielding layer, may include a metal such as copper (Cu), molybdenum (Mo), aluminum (Al), or titanium (Ti), or a metal alloy thereof, may additionally include amorphous silicon, and may be defined by a single layer or a multilayer.

Referring to FIG. 19, a buffer layer 111 for covering the substrate 110 and the metal layer BML may be positioned on the substrate 110 and the metal layer BML. The buffer layer 111 blocks permeation of impure elements into the first semiconductor layer 130, and the buffer layer 111 may be an inorganic insulating layer including at least one selected from a silicon oxide ($SiO_x$), a silicon nitride ($SiN_x$), and a silicon oxynitride ($SiO_xN_y$).

Figure 7:
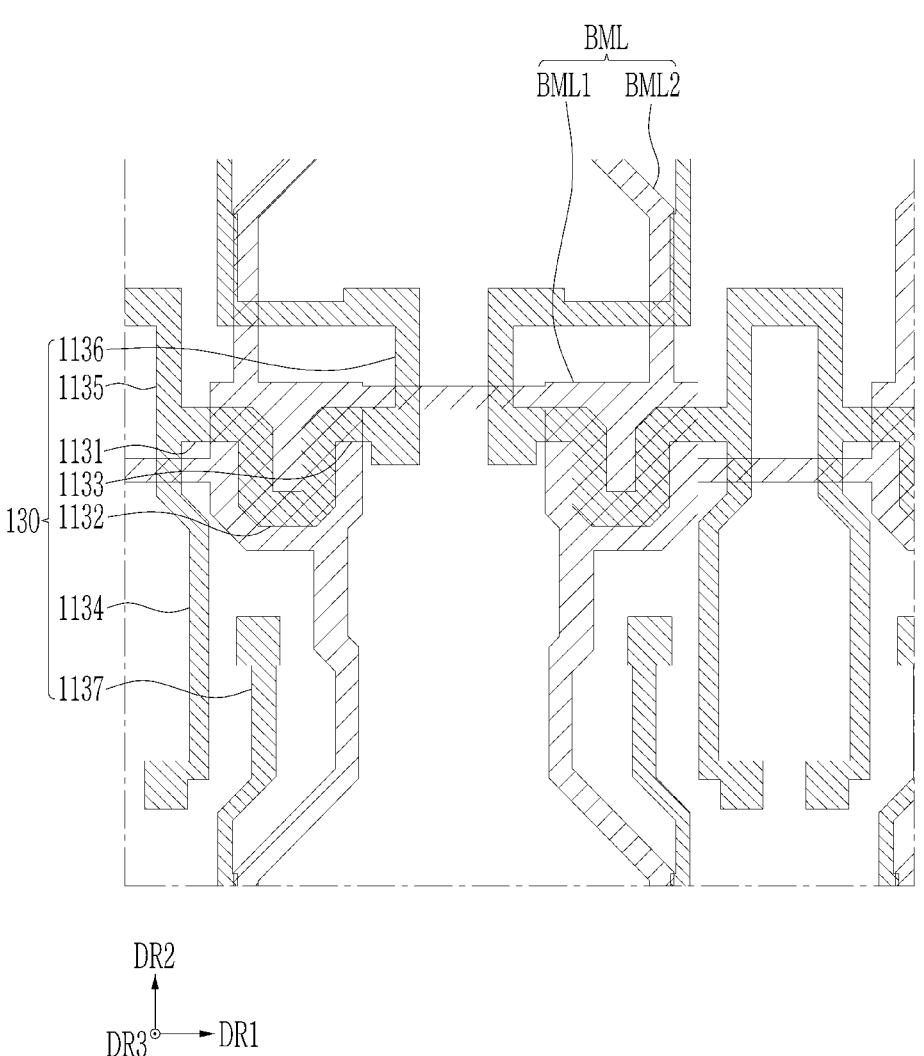

A first semiconductor layer 130 including or made of a silicon semiconductor (e.g., a polycrystalline semiconductor) is positioned on the buffer layer 111, as shown in FIG. 7. The first semiconductor layer 130 includes a channel 1132, a first region 1131, and a second region 1133 of the driving transistor T1. The first semiconductor layer 130 includes channels of the second transistor T2, the fifth transistor T5, the sixth transistor T6, and the seventh transistor T7 in addition to the driving transistor T1, and respective sides of the respective channels have regions with a conductive layer characteristic by a plasma process or doping and function as the first electrode and the second electrode.

The channel 1132 of the driving transistor T1 may have a bent shape in a plan view. The shape of the channel 1132 of the driving transistor T1 is not limited thereto, and may be variously modified. In an embodiment, for example, the channel 1132 of the driving transistor T1 may be bent in other shapes, and may have a bar shape. The first region 1131 and the second region 1133 of the driving transistor T1 may be positioned on respective sides of the channel 1132 of the driving transistor T1. The first region 1131 and the second region 1133 positioned on the first semiconductor layer function as the first electrode and the second electrode of the driving transistor T1.

A channel, a first region, and a second region of the second transistor T2 are defined by a portion 1134 extending downward from the first region 1131 of the driving transistor T1 on the first semiconductor layer 130. A channel, a first region, and a second region of the fifth transistor T5 are defined by a portion 1135 extending upward from the first region 1131 of the driving transistor T1. A channel, a first region, and a second region of the sixth transistor T6 are defined by a portion 1136 extending upward from the second region 1133 of the driving transistor T1. A channel, a first region, and a second region of the seventh transistor T7 may be defined by a portion 1137 bent on the portion 1136 of the first semiconductor layer 130 and further extending therefrom.

Referring to FIG. 19, a first gate insulating layer 141 may be provided or formed on the first semiconductor layer 130 including the channel 1132, the first region 1131, and the second region 1133 of the driving transistor T1. The first gate insulating layer 141 may be an inorganic insulating layer including at least one selected from a silicon oxide ($SiO_x$), a silicon nitride ($SiN_x$), and a silicon oxynitride ($SiO_xN_y$).

Figure 8:
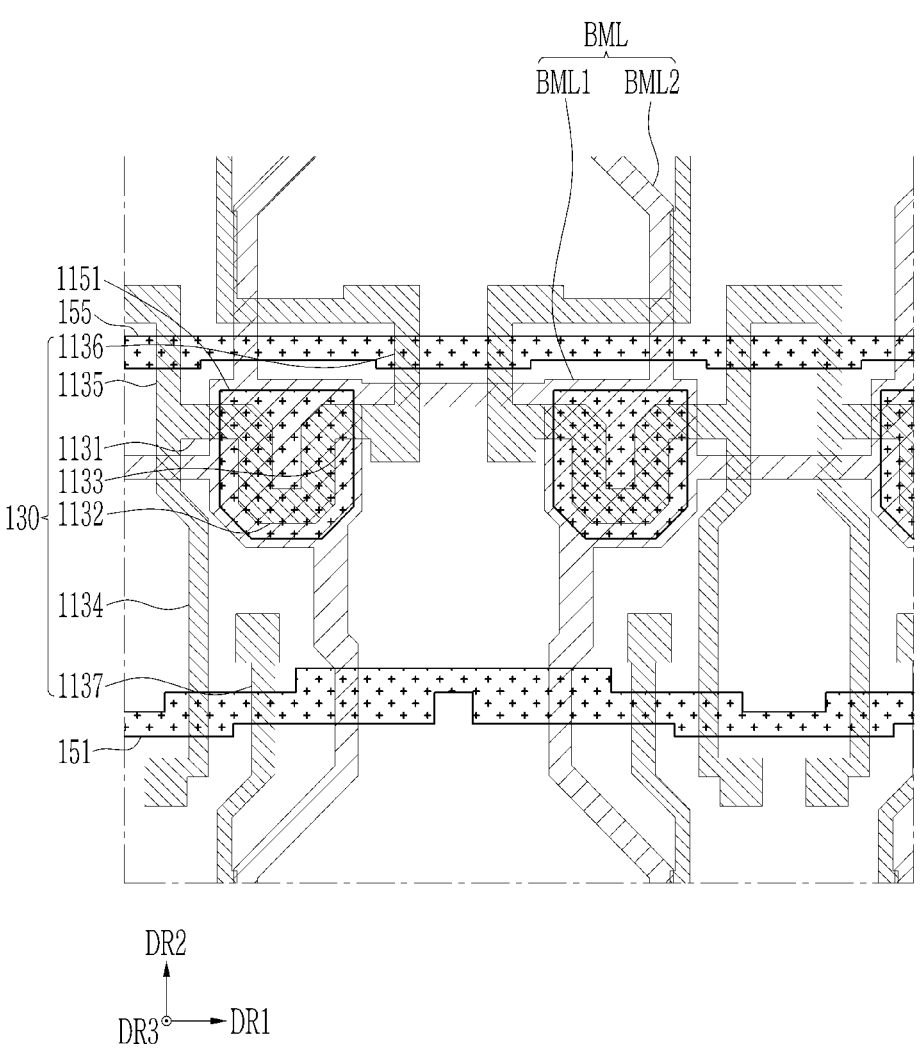

Referring to FIG. 8, a first gate conductive layer including the gate electrode 1151 of the driving transistor T1 may be provided or formed on the first gate insulating layer 141. The first gate conductive layer includes gate electrodes of the respective second transistor T2, the fifth transistor T5, the sixth transistor T6, and the seventh transistor T7 in addition to the driving transistor T1. The gate electrode 1151 of the driving transistor T1 may overlap the channel 1132 of the driving transistor T1. The channel 1132 of the driving transistor T1 is covered by the gate electrode 1151 of the driving transistor T1.

The first gate conductive layer may further include a first scan line 151 and a light emitting control line 155. The first scan line 151 and the light emitting control line 155 may substantially extend in the first direction DR1. In an embodiment, for example, the first direction DR1 may be a row direction. The first scan line 151 may be connected to the gate electrode of the second transistor T2. The first scan line 151 may be integrally formed with the gate electrode of the second transistor T2 as a single unitary and indivisible part. The first scan line 151 is connected to the gate electrode of the seventh transistor T7 of pixel at a rear end.

The light emitting control line 155 may be connected to the gate electrode of the fifth transistor T5 and the gate electrode of the sixth transistor T6, and the light emitting control line 155 and the gate electrodes of the fifth transistor T5 and the sixth transistor T6 may be integrally formed with each other as a single unitary and indivisible part.

The first gate conductive layer may include a metal such as copper (Cu), molybdenum (Mo), aluminum (Al), or titanium (Ti), or a metal alloy thereof, and may be defined by a single layer or a multilayer.

A first gate conductive layer including the gate electrode 1151 of the driving transistor T1 is formed, a plasma process or a doping process is performed to make an exposed region of the first semiconductor layer a conductor. That is, the first semiconductor layer covered by the first gate conductive layer is not made conductive, and the portion of the first semiconductor layer not covered by the first gate conductive layer may have a same characteristic as the conductive layer. As a result, the transistor including a conductive portion may have a p-type transistor characteristic, and the driving transistor T1, the second transistor T2, the fifth transistor T5, the sixth transistor T6, and the seventh transistor T7 may be p-type or n-type transistors.

Referring to FIG. 19, a second gate insulating layer 142 may be provided or formed on the first gate conductive layer including the gate electrode 1151 of the driving transistor T1 and the first gate insulating layer 141. The second gate insulating layer 142 may be an inorganic insulating layer including a silicon oxide ($SiO_x$), a silicon nitride ($SiN_x$), and a silicon oxynitride ($SiO_xN_y$).

Figure 9:
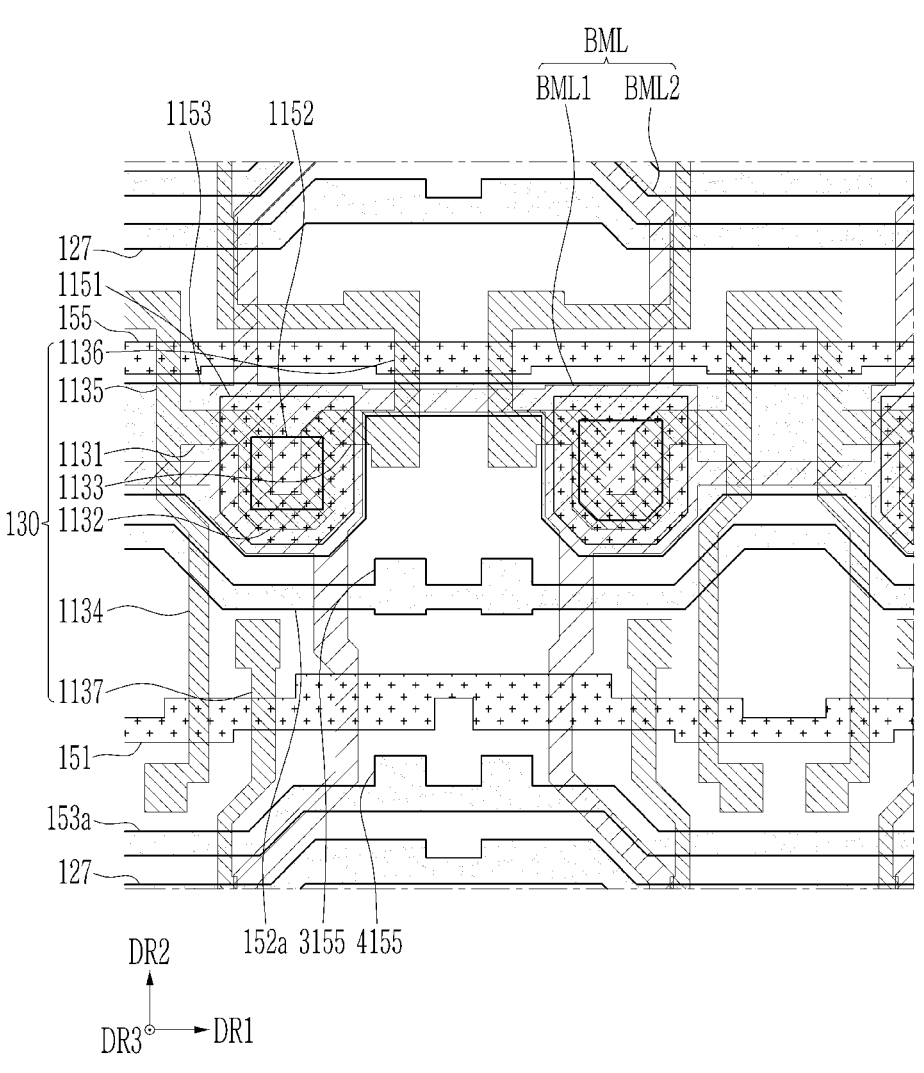

Referring to FIG. 9, a second gate conductive layer including the first storage electrode 1153 of the storage capacitor Cst, the lower shielding layer 3155 of the third transistor T3, and the lower shielding layer 4155 of the fourth transistor T4 may be provided or formed on the second gate insulating layer 142. The lower shielding layers 3155 and 4155 may overlap the lower portions of the channels of the third transistor T3 and the fourth transistor T4 and may shield from light or electromagnetic interference provided to the channel from the lower side.

The first storage electrode 1153 overlaps the gate electrode 1151 of the driving transistor T1 to configure the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The first storage electrode 1153 is connected to the first storage electrode 1153 disposed near by extending in the first direction DR1.

The lower shielding layer 3155 of the third transistor T3 may overlap a channel 3137 of the third transistor T3 and the gate electrode 3151. The lower shielding layer 4155 of the fourth transistor T4 may overlap the channel 4137 of the fourth transistor T4 and the gate electrode 4151.

The second gate conductive layer may further include a lower second scan line 152*a*, a lower initialization control line 153*a*, and a first initialization voltage line 127. The lower second scan line 152*a*, the lower initialization control line 153*a*, and the first initialization voltage line 127 may substantially extend in the first direction DR1. The lower second scan line 152*a* may be connected to the lower shielding layer 3155 of the third transistor T3. The lower second scan line 152*a* may be integrally formed with the lower shielding layer 3155 of the third transistor T3 as a single unitary and indivisible part. The lower initialization control line 153*a* may be connected to the lower shielding layer 4155 of the fourth transistor T4. The lower initialization control line 153*a* may be integrally formed with the lower shielding layer 4155 of the fourth transistor T4 as a single unitary and indivisible part.

The second gate conductive layer GAT2 may include a metal such as copper (Cu), molybdenum (Mo), aluminum (Al), or titanium (Ti), or a metal alloy thereof, and may be defined by a single layer or a multilayer.

Referring to FIG. 19, a first interlayer insulating layer 161 may be positioned on the second gate conductive layer including the first storage electrode 1153 of the storage capacitor Cst, the lower shielding layer 3155 of the third transistor T3, and the lower shielding layer 4155 of the fourth transistor T4. The first interlayer insulating layer 161 may be an inorganic insulating layer including at least one selected from a silicon oxide ($SiO_x$), a silicon nitride ($SiN_x$), and a silicon oxynitride ($SiO_xN_y$), and the inorganic insulating material may selectively have a substantially thick thickness.

Figure 10:
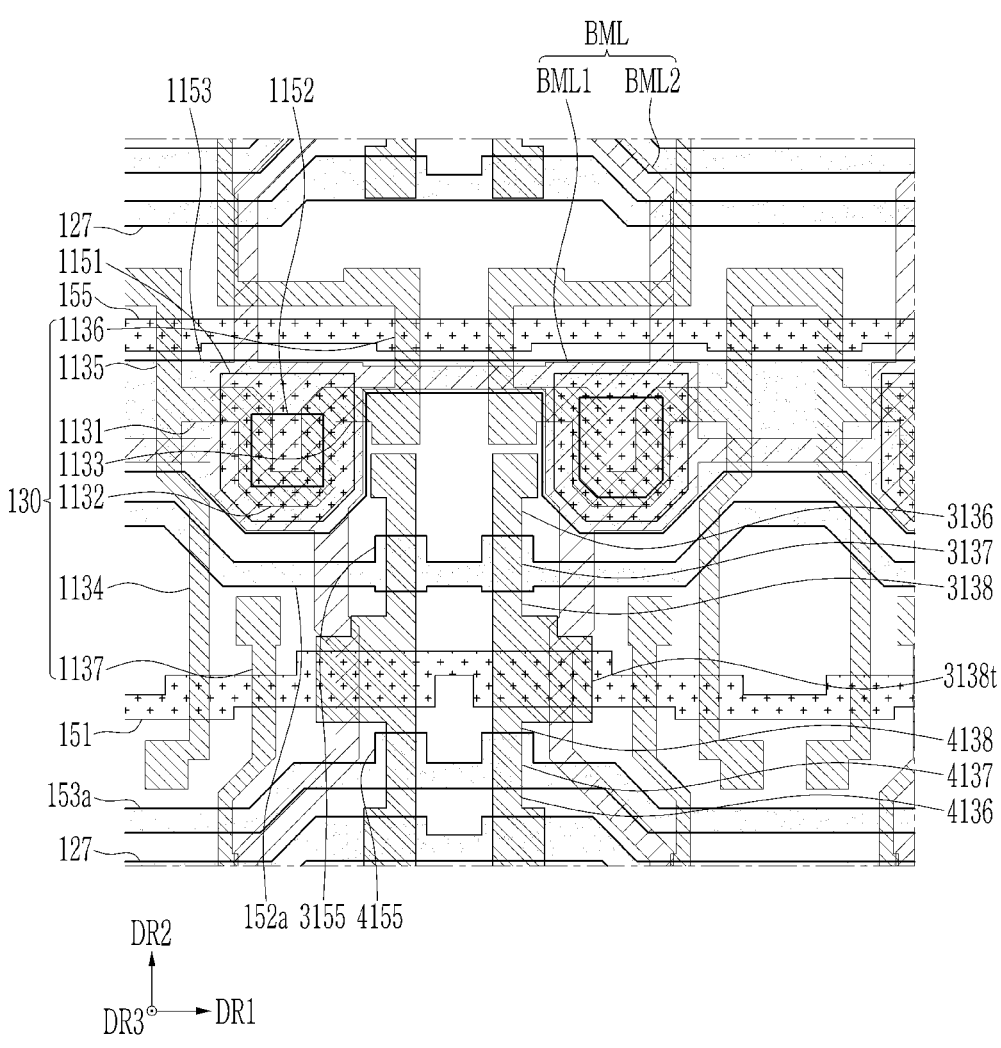

Referring to FIG. 10, an oxide semiconductor layer including (or defining) the channel 3137, the first region 3136, and the second region 3138 of the third transistor T3, and the channel 4137, the first region 4136, and the second region 4138 of the fourth transistor T4 may be provided or formed on the first interlayer insulating layer 161. The oxide semiconductor layer may include an upper boost electrode 3138*t* of the capacitor $C_{boost}$.

The channel 3137, the first region 3136, and the second region 3138 of the third transistor T3, and the channel 4137, the first region 4136, and the second region 4138 of the fourth transistor T4 may be connected to each other and may be integrally formed with each other as a single unitary indivisible unit. The first region 3136 and the second region 3138 of the third transistor T3 may be positioned on respective sides of the channel 3137 of the third transistor T3, and the first region 4136 and the second region 4138 of the fourth transistor T4 may be positioned on respective sides of the channel 4137 of the fourth transistor T4. The second region 3138 of the third transistor T3 is connected to the second region 4138 of the fourth transistor T4. The channel 3137 of the third transistor T3 overlaps the lower shielding layer 3155, and the channel 4137 of the fourth transistor T4 overlaps the lower shielding layer 4155.

An upper boost electrode 3138*t* of the capacitor $C_{boost}$ is provided or formed between the second region 3138 of the third transistor T3 and the second region 4138 of the fourth transistor T4. The upper boost electrode 3138*t* of the boost capacitor $C_{boost}$ overlaps the lower portion boost electrode 151*a* of the boost capacitor $C_{boost}$, and configures the boost capacitor $C_{boost}$.

Referring to FIG. 19, a third gate insulating layer 143 may be provided or formed on an oxide semiconductor layer including the channel 3137, the first region 3136, and the second region 3138 of the third transistor T3, the channel 4137, the first region 4136, and the second region 4138 of the fourth transistor T4, and the upper boost electrode 3138*t* of the boost capacitor $C_{boost}$.

The third gate insulating layer 143 may be positioned on an entire side of the oxide semiconductor layer and the first interlayer insulating layer 161. The third gate insulating layer 143 may cover the channel 3137, the first region 3136, and the second region 3138 of the third transistor T3, the channel 4137, the first region 4136, and the second region 4138 of the fourth transistor T4, and a front surface and a lateral side of the upper boost electrode 3138*t* of the boost capacitor $C_{boost}$. However, the invention is not limited thereto, and the third gate insulating layer 143 may not be positioned on the oxide semiconductor layer and the entire side of the first interlayer insulating layer 161. In an embodiment, for example, the third gate insulating layer 143 may overlap the channel 3137 of the third transistor T3, and may not overlap the first region 3136 and the second region 3138. The third gate insulating layer 143 may overlap the channel 4137 of the fourth transistor T4, and may not overlap the first region 4136 and the second region 4138.

The third gate insulating layer 143 may be an inorganic insulating layer including at least one selected from a silicon oxide ($SiO_x$), a silicon nitride ($SiN_x$), and a silicon oxynitride ($SiO_xN_y$).

Figure 11:
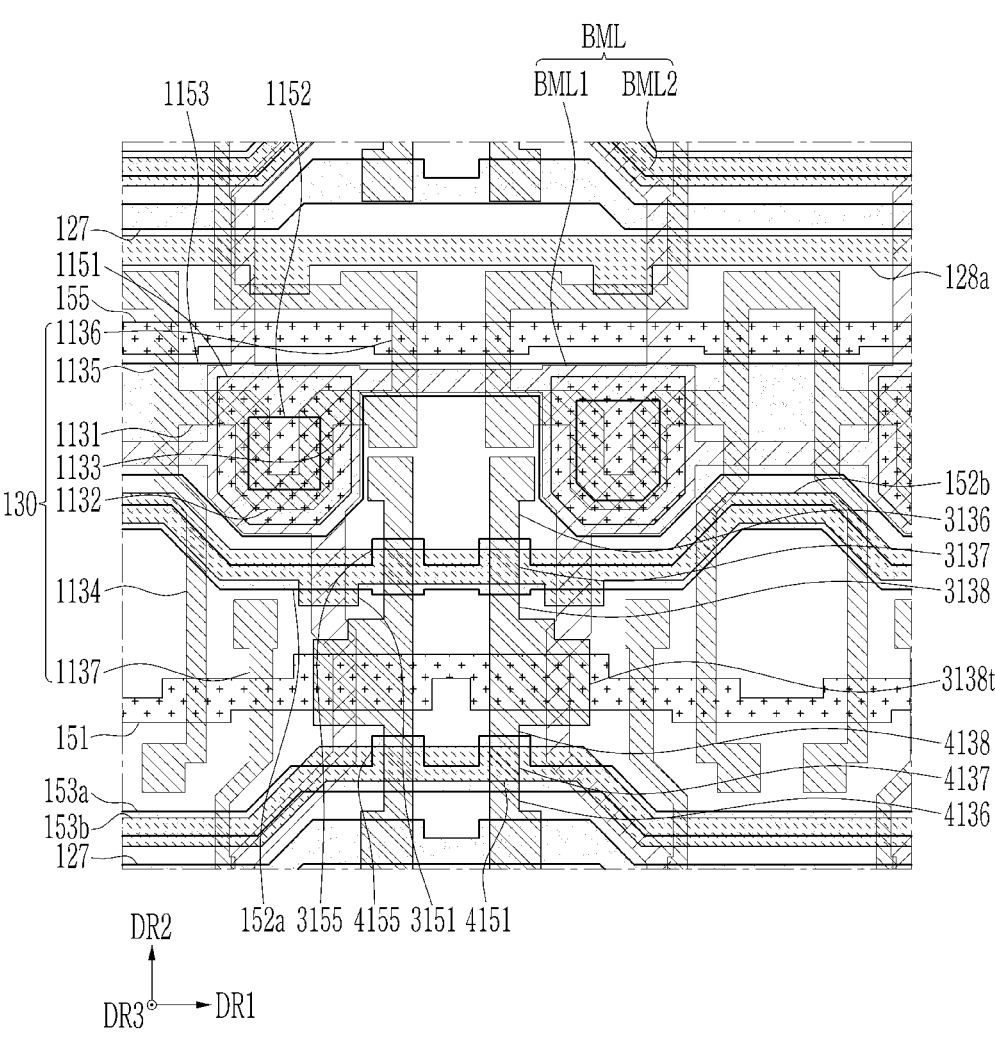

Referring to FIG. 11, a third gate conductive layer including the gate electrode 3151 of the third transistor T3 and the gate electrode 4151 of the fourth transistor T4 may be provided or formed on the third gate insulating layer 143.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The third gate conductive layer may further include an upper second scan line 152*b* and an upper initialization control line 153*b*.

The upper second scan line 152*b* and the upper initialization control line 153*b* may substantially extend in the first direction DR1. The upper second scan line 152*b* configures the second scan line 152 together with the lower second scan line 152*a*. The upper second scan line 152*b* may be connected to the gate electrode 3151 of the third transistor T3. The upper second scan line 152*b* may be integrally formed with the gate electrode 3151 of the third transistor T3 as a single unitary and indivisible part. The upper initialization control line 153*b* configures the initialization control line 153 together with the lower initialization control line 153*a* as a single unitary and indivisible part. The upper initialization control line 153*b* may be connected to the gate electrode 4151 of the fourth transistor T4. The upper initialization control line 153*b* may be integrally formed with the gate electrode 4151 of the fourth transistor T4 as a single unitary and indivisible part.

The third gate conductive layer may further include a lower second initialization voltage line 128*a*. The lower second initialization voltage line 128a may substantially extend in the first direction DR1, and receives the second initialization voltage AVinit.

The third gate conductive layer GAT3 may include a metal such as copper (Cu), molybdenum (Mo), aluminum (Al), or titanium (Ti), or a metal alloy thereof, and may be defined by a single layer or a multilayer.

After the third gate conductive layer including the gate electrode 3151 of the third transistor T3 and the gate electrode 4151 of the fourth transistor T4 is formed, the plasma process or the doping process is performed to form a portion of the oxide semiconductor layer covered by the third gate conductive layer to be a channel and make a portion of the oxide semiconductor layer not covered by the third gate conductive layer a conductor. The channel 3137 of the third transistor T3 may be positioned below the gate electrode 3151 so that the channel 3137 may overlap the gate electrode 3151. The first region 3136 and the second region 3138 of the third transistor T3 may not overlap the gate electrode 3151. The channel 4137 of the fourth transistor T4 may be positioned below the gate electrode 4151 so that the channel 4137 thereof may overlap the gate electrode 4151. The first region 4136 and the second region 4138 of the fourth transistor T4 may not overlap the gate electrode 4151. The upper boost electrode 3138t may not overlap the third gate conductive layer. The transistor including an oxide semiconductor layer may have the characteristic of the n-type transistor.

Referring to FIG. 19, a second interlayer insulating layer 162 may be provided or formed on the third gate conductive layer including the gate electrode 3151 of the third transistor T3 and the gate electrode 4151 of the fourth transistor T4. The second interlayer insulating layer 162 may have a single-layered or multi-layered structure. The second interlayer insulating layer 162 may be an inorganic insulating layer including at least one selected from a silicon oxide ($SiO_x$), a silicon nitride ($SiN_x$), and a silicon oxynitride ($SiO_xN_y$). Alternatively, second interlayer insulating layer 162 may further include an organic material.

Figure 12:
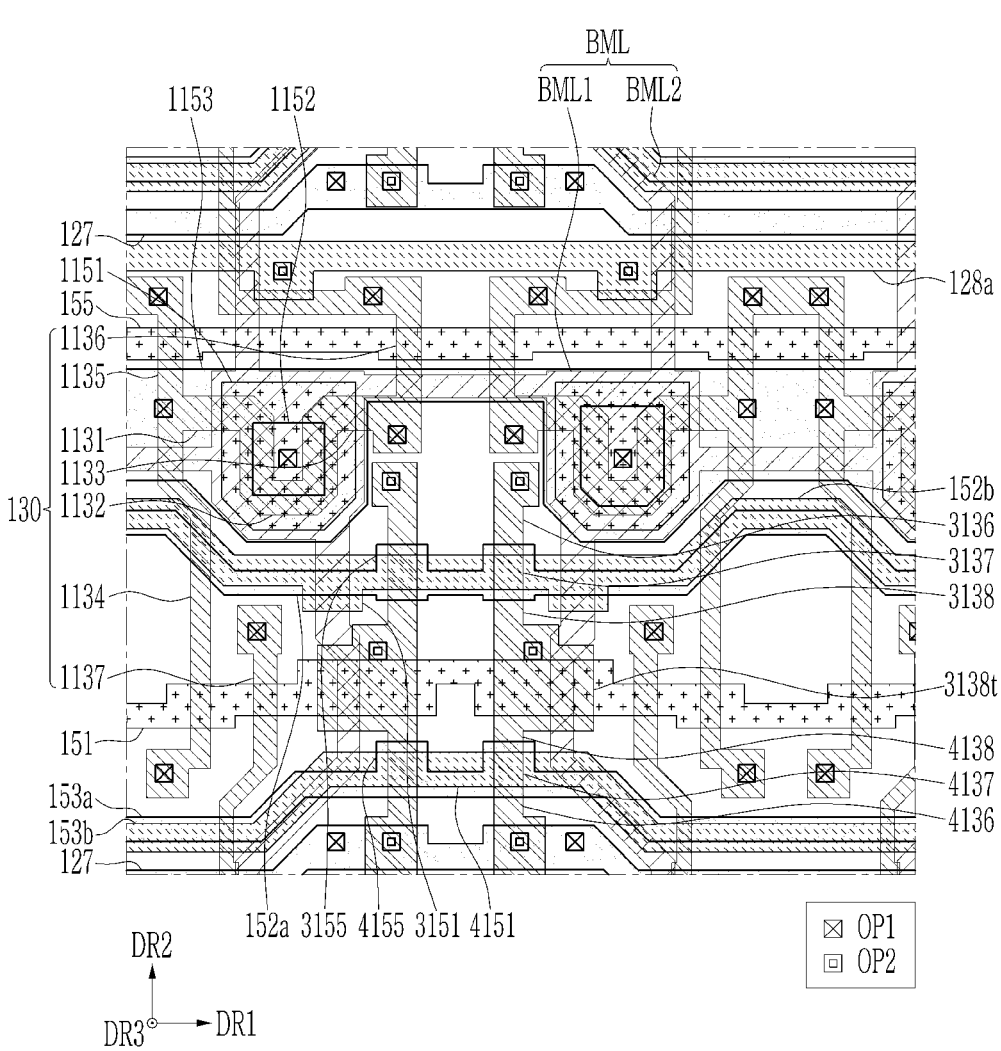

Referring to FIG. 12, the second interlayer insulating layer 162 may include two types of openings OP1 and OP2, that is, two types of openings, e.g., first openings OP1 and second openings OP2, may be formed through the second interlayer insulating layer 162. The first and second openings OP1 and OP2 may be formed by using different masks from each other.

The first openings OP1 may be formed in at least one of the second interlayer insulating layer 162, the third gate insulating layer 143, the first interlayer insulating layer 161, the second gate insulating layer 142, and the first gate insulating layer 141, and may expose the first semiconductor layer 130, the first gate conductive layer, or the second gate conductive layer.

The second openings OP2 may be formed in the second interlayer insulating layer 162 and/or the third gate insulating layer 143, and may expose the oxide semiconductor layer or the third gate conductive layer.

One of the openings OP1 may overlap at least part of the gate electrode 1151 of the driving transistor T1, and may also be formed in the third gate insulating layer 143, the first interlayer insulating layer 161, and the second gate insulating layer 142. The one of the first openings OP1 may overlap the opening 1152 of the first storage electrode 1153, and may be positioned inside the opening 1152 of the first storage electrode 1153.

One of the second openings OP2 may overlap at least part of the boost capacitor $C_{boost}$, and may be further formed in the third gate insulating layer 143.

Another of the first openings OP1 may overlap at least part of the second region 1133 of the driving transistor T1, and may be formed in the third gate insulating layer 143, the first interlayer insulating layer 161, the second gate insulating layer 142, and the first gate insulating layer 141.

Another of the second openings OP2 may overlap at least part of the first region 3136 of the third transistor T3, and may be formed in the third gate insulating layer 143.

Figure 13:
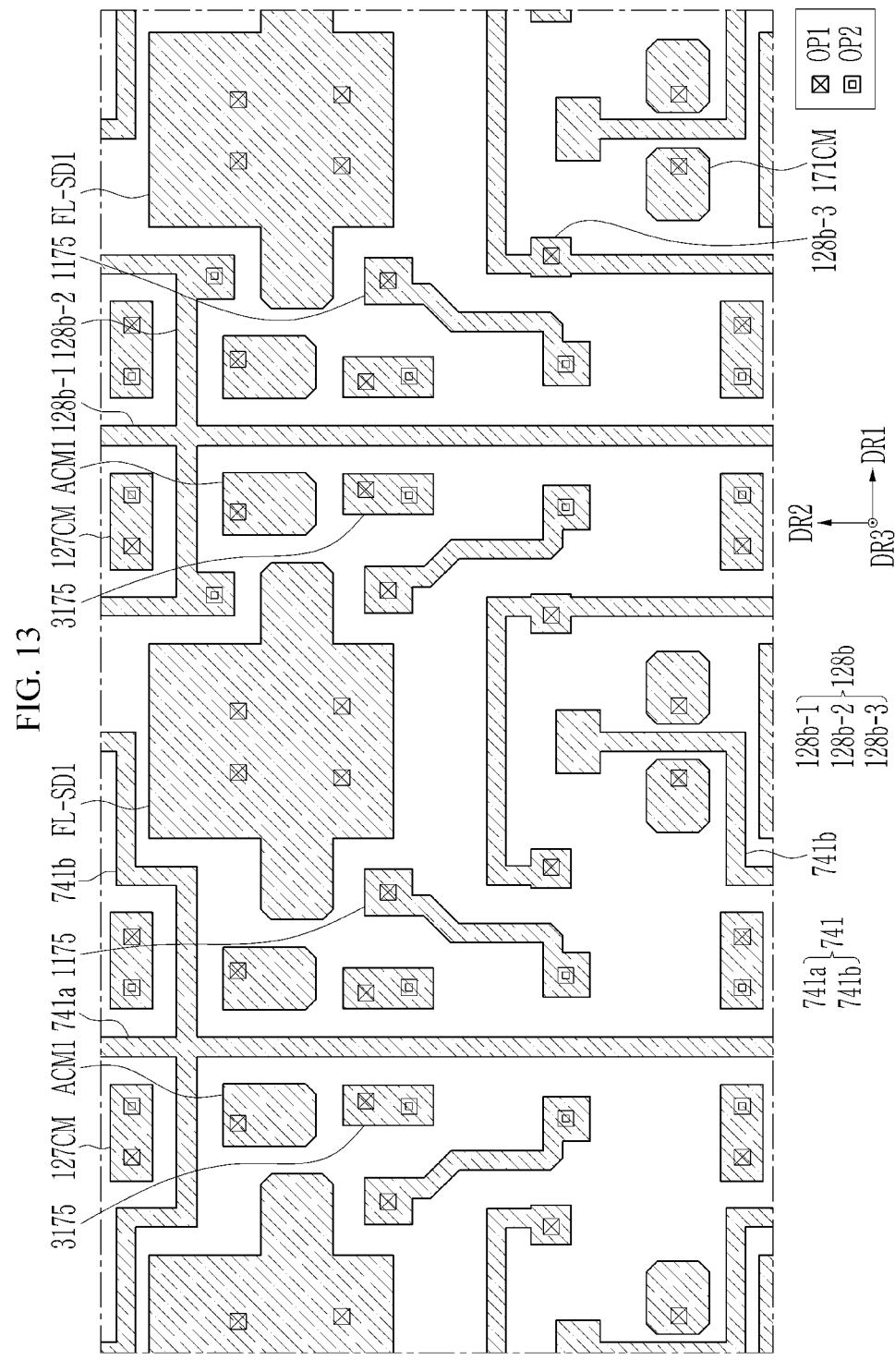
Figure 14:
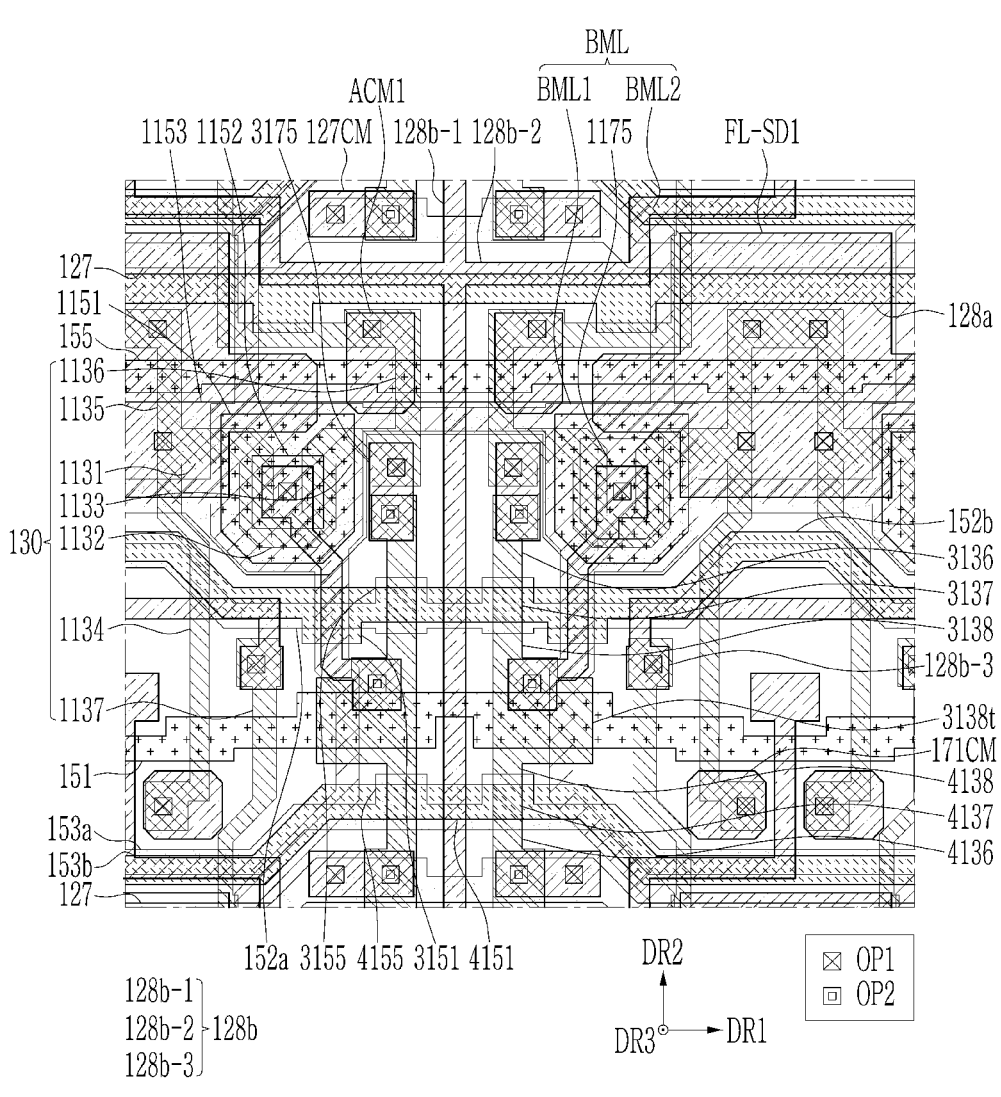

Referring to FIG. 13 and FIG. 14, a first data conductive layer including the first connection electrode 1175 and the second connection electrode 3175 may be provided or formed on the second interlayer insulating layer 162. FIG. 13 shows a top plan view of a first data conductive layer and openings OP1 and OP2 in FIG. 14, and FIG. 14 shows a top plan view of the first data conductive layer and the layers therebelow.

The first connection electrode 1175 may overlap the gate electrode 1151 of the driving transistor T1. The first connection electrode 1175 may be connected to the gate electrode 1151 of the driving transistor T1 through the opening OP1 and the opening 1152 of the first storage electrode 1153. The first connection electrode 1175 may overlap the boost capacitor $C_{boost}$. The first connection electrode 1175 may be connected to the upper boost electrode 3138t of the boost capacitor $C_{boost}$ through the opening OP2. In such an embodiment, the gate electrode 1151 of the driving transistor T1 may be connected to the upper boost electrode 3138t of the boost capacitor $C_{boost}$ by the first connection electrode 1175. The gate electrode 1151 of the driving transistor T1 may also be connected to the second region 3138 of the third transistor T3 and the second region 4138 of the fourth transistor T4 by the first connection electrode 1175.

The second connection electrode 3175 may overlap the second region 1133 of the driving transistor T1. The second connection electrode 3175 may be connected to the second region 1133 of the driving transistor T1 through the opening OP1. The second connection electrode 3175 may overlap the first region 3136 of the third transistor T3. The second connection electrode 3175 may be connected to the first region 3136 of the third transistor T3 through the opening OP2. Therefore, the second region 1133 of the driving transistor T1 may be connected to the first region 3136 of the third transistor T3 by the second connection electrode 3175.

The first data conductive layer may further include an upper second initialization voltage line 128b and a common voltage line 741.

The upper second initialization voltage line 128b includes a wire portion 128b-1 extending in the second direction DR2, a first extension 128b-2 protruding from respective sides in the first direction DR1 of the wire portion 128b-1, and a second extension 128b-3 bent in the second direction DR2 from the first extension 128b-2. The second direction DR2 may be perpendicular to the first direction DR1. In an embodiment, for example, the second direction DR2 may be a column direction. A portion of the upper second initialization voltage line 128b where the first extension 128b-2 meets the second extension 128b-3 is electrically connected to the lower second initialization voltage line 128a positioned on the third gate conductive layer through the opening OP2. As a result, the second initialization voltage AVinit is transmitted in the first direction DR1 through the lower second initialization voltage line 128a positioned on the third gate conductive layer, and is transmitted in the second direction DR2 through the upper second initialization voltage line 128*b* positioned on the first data conductive layer.

The upper second initialization voltage line 128*b* is electrically connected to one portion 1137 of the first semiconductor layer 130 through the opening OP1 at the end portion of the second extension 128*b*-3. In an embodiment, the upper second initialization voltage line 128*b* may further include a portion extending in the first direction DR1 from the end portion of the second extension 128*b*-3, and an end portion of the extended portion may be electrically connected to one portion 1137 of the first semiconductor layer 130 of the neighboring pixel.

The common voltage line 741 may include a first portion 741*a* extending in the second direction DR2 and a second portion 741*b* protruding from the first portion 741*a* and extending in the first direction DR1 and the second direction DR2. The common voltage line 741 may be connected to a plurality of pixels disposed near in the second direction DR2. The first portion 741*a* of the common voltage line 741 may extend to reach another edge of the substrate 110 from one edge thereof. The common voltage line 741 may be connected to a common voltage transmitting line (not shown) for transmitting the common voltage ELVSS from at least one selected from one edge and another edge of the substrate 110. The second portion 741*b* of the common voltage line 741 may have a shape that is bent in the first direction DR1 and the second direction DR2 multiple times. The shape of the second portion 741*b* of the common voltage line 741 is not limited thereto and may be variously modified. The end portion of the second portion 741*b* of the common voltage line 741 may have a greater width than other portions.

Figure 20:
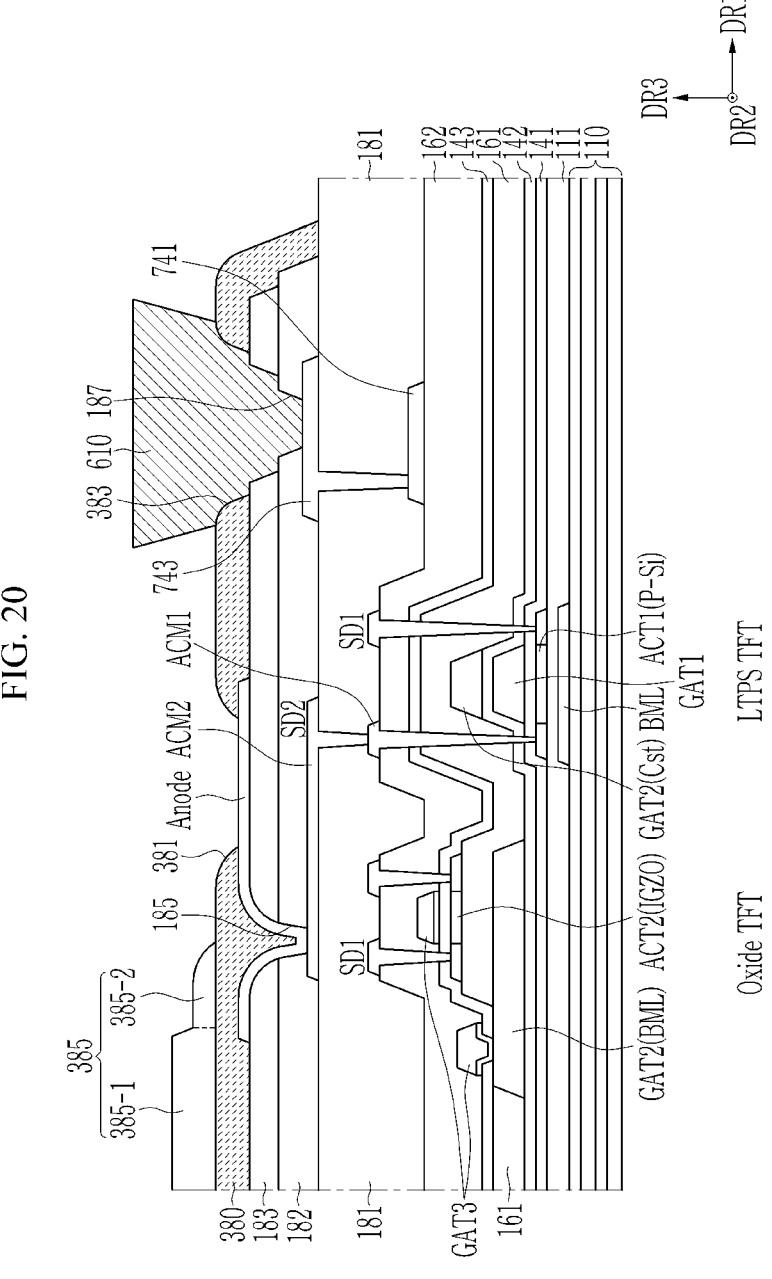

The upper second initialization voltage line 128*b* and the common voltage line 741 may be alternately disposed. In an embodiment, for example, the upper second initialization voltage line 128*b* and the common voltage line 741 may be alternately disposed in the first direction DR1 up to another edge of the substrate 110 from one edge thereof. FIG. 19 shows three adjacent pixels, and shows the common voltage line 741 and the upper second initialization voltage line 128*b*. FIG. 20 shows two adjacent pixels, shows a common voltage line 741, and part of the upper second initialization voltage line 128*b* is omitted in FIG. 20.

The first data conductive layer may further include connectors 127 CM and 171 CM, a first anode connecting member ACM1, and an extension FL-SD1.

The connector 127 CM is connected to the first initialization voltage line 127 of the second gate conductive layer through the opening OP1, and is connected to the one portion 4136 of the second semiconductor layer (or an oxide semiconductor layer) through the opening OP2 to transmit the first initialization voltage Vinit flowing to the first initialization voltage line 127 to the fourth transistor T4 of the oxide semiconductor layer.

The connector 171 CM is electrically connected to one portion 1137 of the first semiconductor layer 130, that is, the second transistor T2, through the opening OP1.

The first anode connecting member ACM1 is electrically connected to one portion 1136 of the first semiconductor layer 130, that is, the sixth transistor T6, through the opening OP1.

The extension FL-SD1 is widely formed to planarize the anode positioned on the upper side. The extension FL-SD1 is connected to one portion 1135 of the first semiconductor layer 130, that is, the fifth transistor T5, through the opening OP1, and may be electrically connected to the first storage electrode 1153 through the opening OP1.

The first data conductive layer SD1 may include a metal such as aluminum (Al), copper (Cu), molybdenum (Mo), or titanium (Ti), or a metal alloy thereof, and may be defined by a single layer or a multilayer.

Referring to FIG. 19, a first organic film 181 may be provided or formed on the first data conductive layer including the first connection electrode 1175 and the second connection electrode 3175. The first organic film 181 may be an organic insulator including an organic material, and the organic material may include at least one material selected from a polyimide, a polyamide, an acryl resin, a benzocyclobutene, and a phenol resin.

Figure 15:
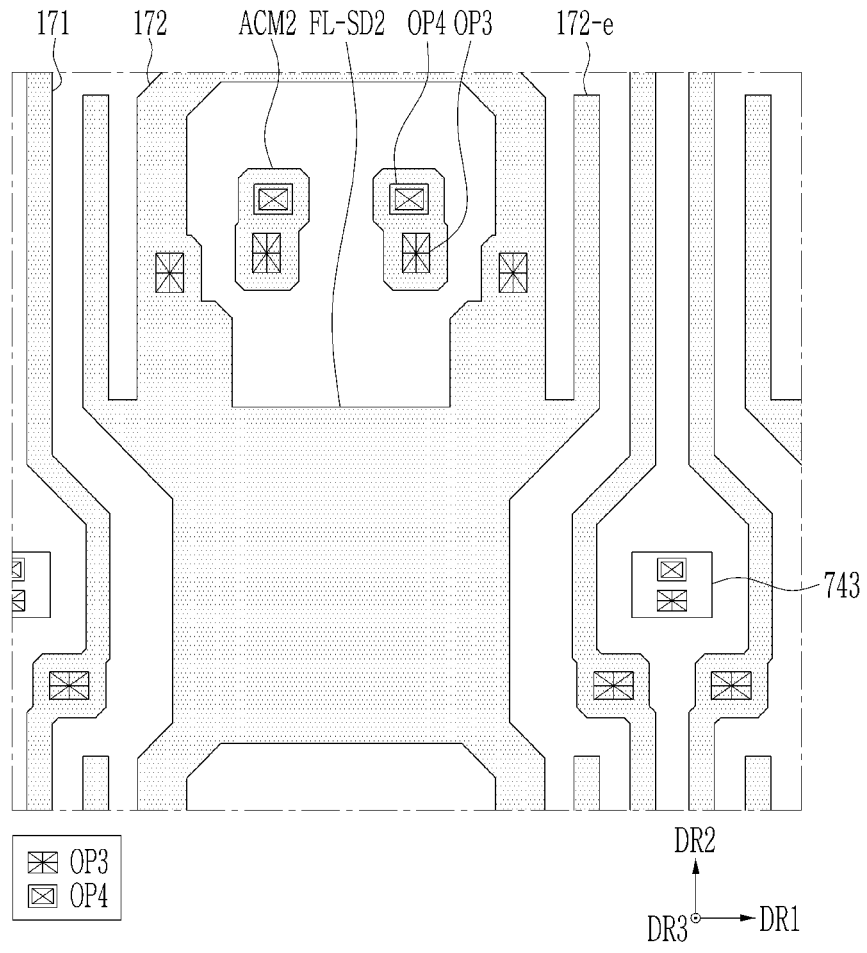
Figure 16:
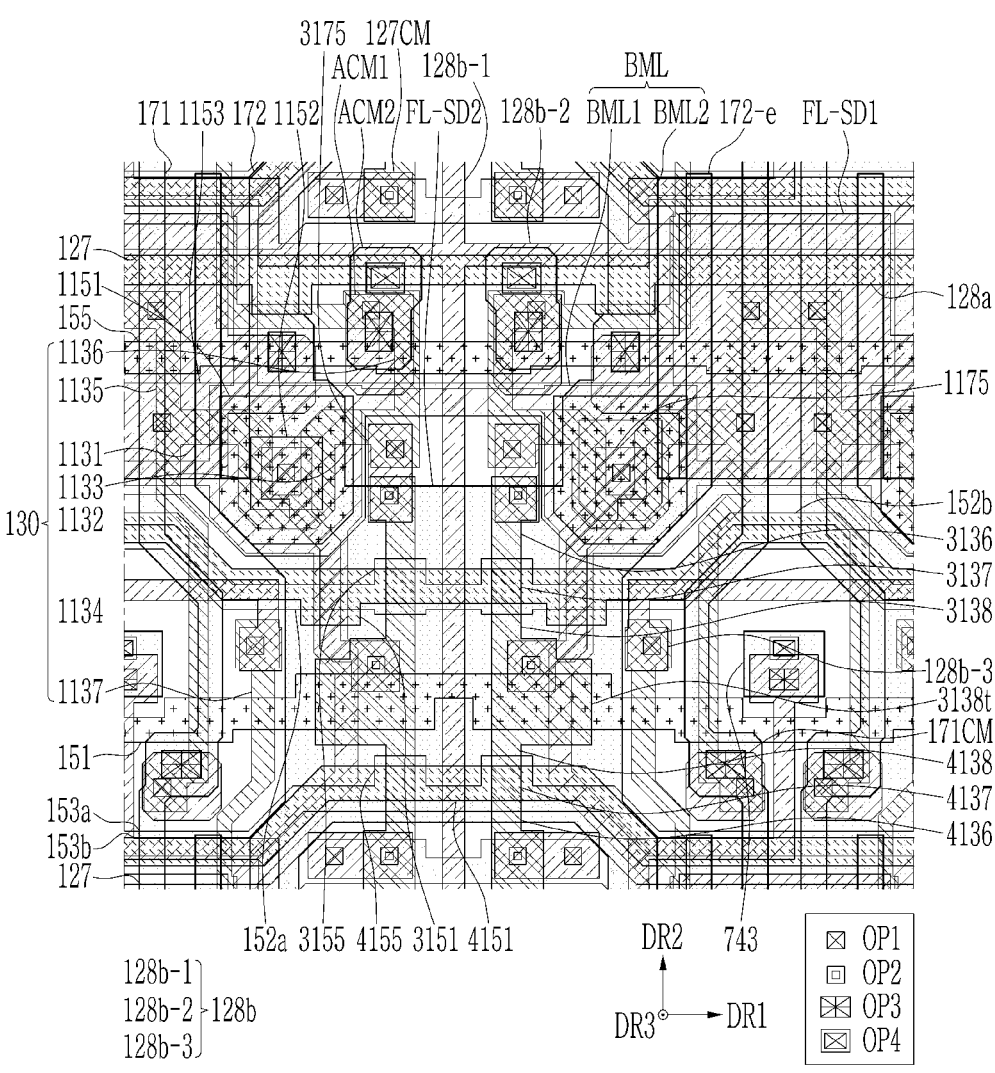

Referring to FIG. 15, FIG. 16, and FIG. 19, an opening OP3 is formed in the first organic film 181. A second data conductive layer including a data line 171, a driving voltage line 172, a second anode connecting member ACM2, and a cathode connecting member 743 may be provided or formed on the first organic film 181. A second organic film 182 and a third organic film 183 are provided or formed on the second data conductive layer, and an opening OP4 is formed in the second organic film 182 and the third organic film 183. The second anode connecting member ACM2 is electrically connected to the anode through the opening OP4. FIG. 15 shows a top plan view of a second data conductive layer and openings OP3 and OP4 in FIG. 16, and FIG. 16 shows a top plan view of a second data conductive layer and layers disposed near the second data conductive layer.

Referring to FIG. 15 and FIG. 16, the opening OP3 overlaps the connector 171 CM, the first anode connecting member ACM1, the common voltage line 741, and the extension FL-SD1 positioned on the first data conductive layer and exposes portions thereof.

The data line 171 and the driving voltage line 172 may substantially extend in the second direction DR2. The data line 171 is connected to the connector 171 CM of the first data conductive layer through the opening OP3, and by this connection, it is then connected to the second transistor T2. The driving voltage line 172 passes through the extension FL-SD1 of the first data conductive layer through the opening OP3 and is electrically connected to the fifth transistor T5 and the first storage electrode 1153. The second anode connecting member ACM2 is electrically connected to the first anode connecting member ACM1 of the first data conductive layer through the opening OP3, and is electrically connected to the sixth transistor T6. The cathode connecting member 743 may be electrically connected to the common voltage line 741 of the first data conductive layer through the opening OP3, and may receive the common voltage ELVSS.

The driving voltage line 172 further includes an extension FL-SD2 and a protruding wire portion 172-*e*, and is not formed on a portion on which the second anode connecting member ACM2 is formed.

The extension FL-SD2 is made wide to planarize the anode positioned on the upper side thereof.

The two protruding wire portions 172-*e* of the driving voltage line 172 are formed on respective sides of the two data lines 171, and a total of the four wire structures 171 and 172-*e* are formed on the lower portion of the anode to planarize the anode positioned thereon.

The anode may have a planarization characteristic by the structure (the extension FL-SD1 and the wire portion 128*b*-1 of the first data conductive layer, and the extension FL-SD2, the data line 171, and the protruding wire portion 172-*e* of the second data conductive layer) of the lower portion of the anode and the organic films 181, 182, and 183.

The extension FL-SD1 and the extension FL-SD2 are electrically connected to the driving voltage line 172 and transmit the driving voltage ELVDD.

The second data conductive layer SD2 may include a metal such as aluminum (Al), copper (Cu), molybdenum (Mo), or titanium (Ti), or a metal alloy thereof, and may be defined by a single layer or a multilayer.

Referring to FIG. 19, the second organic film 182 and the third organic film 183 are provided or formed on the second data conductive layer. The second organic film 182 and the third organic film 183 may be organic insulators, and may include at least one material selected from a polyimide, a polyamide, an acryl resin, a benzocyclobutene, and a phenol resin. Alternatively, the third organic film 183 may be omitted.

An opening OP4 may be formed in the second organic film 182 and the third organic film 183. The anode and the second anode connecting member ACM2 may be electrically connected to each other through the opening OP4. The cathode and the cathode connecting member 743 may be electrically connected to each other through the opening OP4.

Figure 17:
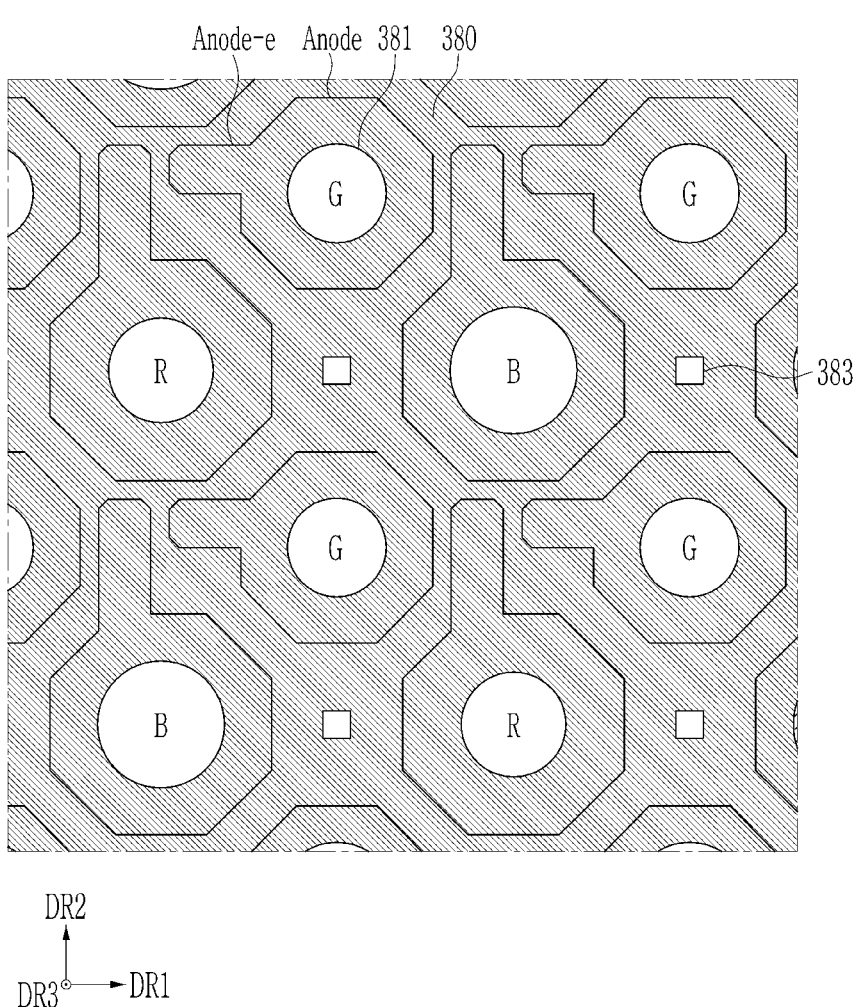
Figure 18:
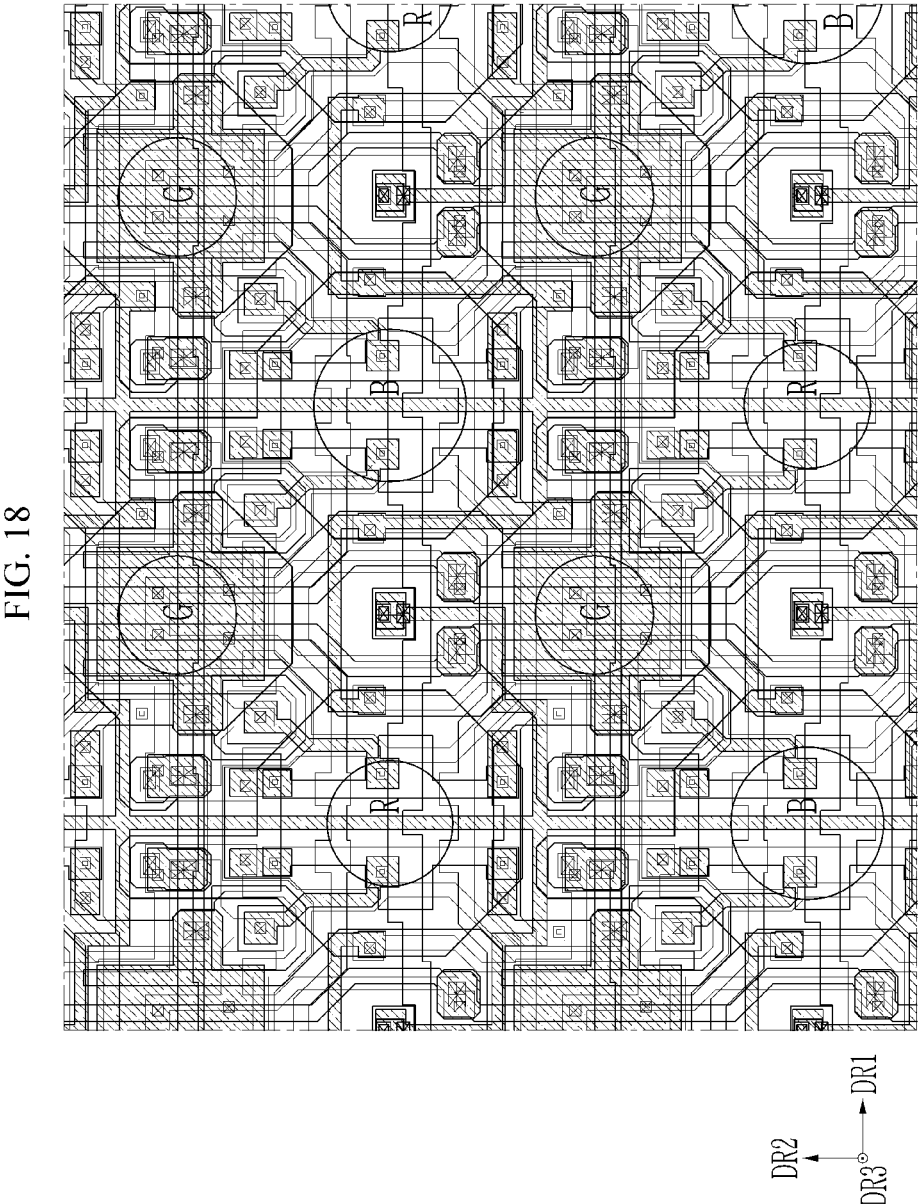

Referring to FIG. 17, FIG. 18, and FIG. 19, an anode is provided or formed on the third organic film 183. The anode may further include an extension Anode-e for receiving a current from the pixel circuit unit through the opening OP4.

A pixel defining layer 380 is provided or formed on the anode, and openings 381 and 383 of the pixel defining layer 380 overlap the anode and the cathode connecting member 743.

A cross-sectional structure of a light emitting display device according to an embodiment, and a manufacturing method thereof, will now be described based on the structure in a plan view with reference to FIG. 19 to FIG. 24.

The light emitting display device includes the substrate 110 and a plurality of transistors positioned on the substrate 110. The substrate 110 may include a material that has a rigid characteristic and may not be bent such as plastic or may include a flexible material that is bent such as a polyimide. FIG. 19 shows an embodiment where the substrate 110 is a flexible substrate, and illustrates the substrate 110 having a double-stacked structure in which each stack is defined by a polyimide and a barrier layer on the polyimide and including an inorganic insulating material. Some of a plurality of transistors may be configured with oxide semiconductor transistors (Oxide TFT), and the others thereof may be configured with silicon semiconductor transistors (LTPS TFT). However, without being limited thereto, a plurality of transistors may be configured with one kind of transistor, and the planar and cross-sectional structures may be accordingly changed. In an embodiment, for example, a plurality of transistors may be configured with the silicon semiconductor transistors (LTPS TFT). The cross-sectional structures of the oxide semiconductor transistor (Oxide TFT) and the silicon semiconductor transistor (LTPS TFT) will now be described.

A metal layer BML is provided or formed on the substrate 110, and the metal layer BML is positioned in a region overlapping the channel of the first semiconductor layer ACT1. The metal layer BML may also be referred to as a lower shielding layer, may include a metal such as aluminum (Al), copper (Cu), molybdenum (Mo), or titanium (Ti), or a metal alloy thereof, and may be defined by a single layer or a multilayer. A buffer layer 111 for covering the metal layer BML may be provided or formed on the metal layer BML, the buffer layer 111 blocks permeation of impure elements into the first semiconductor layer, and may be an inorganic insulating layer including at least one selected from a silicon oxide ($SiO_x$), a silicon nitride ($SiN_x$), and a silicon oxynitride ($SiO_xN_y$).

A first semiconductor layer ACT1 is provided or formed on the buffer layer 111. The first semiconductor layer ACT1 includes a channel region, and a first region and a second region positioned on respective sides of the channel region.

The first gate insulating layer 141 may cover the first semiconductor layer ACT1 or may overlap the channel region of the first semiconductor layer ACT1. The first gate insulating layer 141 may be an inorganic insulating layer including at least one selected from a silicon oxide ($SiO_x$), a silicon nitride ($SiN_x$), and a silicon oxynitride ($SiO_xN_y$).

A first gate conductive layer GAT1 is provided or formed on the first gate insulating layer 141, and the first gate conductive layer GAT1 includes a gate electrode of the silicon semiconductor transistor (LTPS TFT). The first gate conductive layer GAT1 may include a metal such as copper (Cu), molybdenum (Mo), aluminum (Al), or titanium (Ti), or a metal alloy thereof, and may be defined by a single layer or a multilayer. A region overlapping the gate electrode from among the first semiconductor layer ACT1 in a plan view may be a channel region. The gate electrode may function as one electrode of the storage capacitor.

The first gate conductive layer GAT1 is covered by the second gate insulating layer 142, and the second gate insulating layer 142 may be an inorganic insulating layer including at least one selected from a silicon oxide ($SiO_x$), a silicon nitride ($SiN_x$), and a silicon oxynitride ($SiO_xN_y$).

A second gate conductive layer GAT2 is provided or formed on the second gate insulating layer 142, and the second gate conductive layer GAT2 may include a first storage electrode overlapping the gate electrode and configuring the storage capacitor, and a lower shielding layer for the oxide semiconductor transistor Oxide TFT positioned on the lower portion of the oxide semiconductor layer ACT2. The second gate conductive layer GAT2 may include a metal such as copper (Cu), molybdenum (Mo), aluminum (Al), or titanium (Ti), or a metal alloy thereof, and may be defined by a single layer or a multilayer.

The second gate conductive layer GAT2 may be covered by the first interlayer insulating layer 161, and may include an inorganic insulating layer including at least one selected from a silicon oxide ($SiO_x$), a silicon nitride ($SiN_x$), and a silicon oxynitride ($SiO_xN_y$).

An oxide semiconductor layer ACT2 is provided or formed on the first interlayer insulating layer 161, and the oxide semiconductor layer ACT2 includes a channel region, and a first region and a second region positioned on respective sides of the channel region.

The oxide semiconductor layer ACT2 may be covered by the third gate insulating layer 143, and the third gate insulating layer 143 may include an inorganic insulating layer including at least one selected from a silicon oxide ($SiO_x$), a silicon nitride ($SiN_x$), and a silicon oxynitride ($SiO_xN_y$).

The third gate insulating layer 143 and the first interlayer insulating layer 161 may have a structure in which an opening overlapping part of the lower shielding layer for the oxide semiconductor transistor (Oxide TFT) from among the second gate conductive layer GAT2 is defined.

A third gate conductive layer GAT3 is provided or formed on the third gate insulating layer 143, and the third gate conductive layer GAT3 includes a connecting member connected to the gate electrode of the oxide semiconductor transistor (Oxide TFT) and the lower shielding layer for the oxide semiconductor transistor (Oxide TFT). The third gate conductive layer GAT3 may include a metal such as copper (Cu), molybdenum (Mo), aluminum (Al), or titanium (Ti), or a metal alloy thereof, and may be defined by a single layer or a multilayer.

The third gate conductive layer GAT3 may be covered by the second interlayer insulating layer 162, and the second interlayer insulating layer 162 may include an inorganic insulating layer including at least one selected from a silicon oxide ($SiO_x$), a silicon nitride ($SiN_x$), and a silicon oxynitride ($SiO_xN_y$), and may further include an organic material.

The second interlayer insulating layer 162 and the insulating layer positioned on the lower portion thereof may have a structure in which an opening overlapping the first semiconductor layer ACT1 and the oxide semiconductor layer ACT2 is defined.

A first data conductive layer SD1 is provided or formed on the second interlayer insulating layer 162, and the first data conductive layer SD1 may include a connecting member and may provide a voltage or a current to the first semiconductor layer ACT1 and the oxide semiconductor layer ACT2 or may provide the voltage or the current to other elements. The first data conductive layer SD1 may include a metal such as aluminum (Al), copper (Cu), molybdenum (Mo), or titanium (Ti), or a metal alloy thereof, and may be defined by a single layer or a multilayer.

In an embodiment, for example, the above-described first anode connecting member ACM1 and the common voltage line 741 may be formed as the first data conductive layer SD1. That is, the first anode connecting member ACM1 and the common voltage line 741 may be simultaneously formed through a same process. Therefore, the first anode connecting member ACM1 and the common voltage line 741 may be positioned in a same layer as each other and may include a same material as each other. The first anode connecting member ACM1 may be connected to a transistor. In an embodiment, for example, the first anode connecting member ACM1 may be connected to the sixth transistor T6.

A first organic film 181 may be provided or formed on the first data conductive layer SD1. In an embodiment, for example, the first organic film 181 may be formed on the first anode connecting member ACM1 and the common voltage line 741. The first data conductive layer SD1 is covered by the first organic film 181. The first organic film 181 may be an organic insulator including an organic material, and the organic material may include at least one material selected from a polyimide, a polyamide, an acryl resin, a benzocyclobutene, and a phenol resin.

An opening overlapping the first data conductive layer SD1 may be formed in the first organic film 181, and a second data conductive layer SD2 may be formed on the first organic film 181. In an embodiment, for example, the above-described second anode connecting member ACM2 and the cathode connecting member 743 may be formed with the second data conductive layer SD2. That is, the second anode connecting member ACM2 and the cathode connecting member 743 may be simultaneously formed through a same process. Therefore, the second anode connecting member ACM2 and the cathode connecting member 743 may be positioned in a same layer as each other and may include a same material as each other.

The second data conductive layer SD2 may be connected to the first data conductive layer SD1 through an opening. In an embodiment, for example, the second anode connecting member ACM2 may be connected to the first anode connecting member. The cathode connecting member 743 may be connected to the common voltage line 741.

The second data conductive layer SD2 may include a metal such as aluminum (Al), copper (Cu), molybdenum (Mo), or titanium (Ti), or a metal alloy thereof, and may be defined by a single layer or a multilayer.

A second organic film 182 and a third organic film 183 may be provided or formed on the second data conductive layer SD2. In an embodiment, for example, the second organic film 182 and the third organic film 183 may be formed on the second anode connecting member ACM2 and the cathode connecting member 743. The second organic film 182 and the third organic film 183 may be an organic insulator, polyimide, and may include at least one material selected from a polyamide, an acryl resin, a benzocyclobutene, and a phenol resin. Alternatively, the third organic film 183 may be omitted. The anode may have a flatter characteristic because of the third organic film 183.

Openings 185 and 187 may be formed in the second organic film 182 and the third organic film 183. In an embodiment, for example, the first opening 185 may be formed to overlap the second anode connecting member ACM2. A front surface of the second anode connecting member ACM2 may be exposed by the first opening 185. The first opening 185 may overlap a transistor. The second opening 187 may be formed to overlap the cathode connecting member 743. The front surface of the cathode connecting member 743 may be exposed by the second opening 187. The second opening 187 may overlap the common voltage line 741.

An anode may be provided or formed on the third organic film 183. The anode may also be provided in the first opening 185. The anode may be connected to the second anode connecting member ACM2 through the first opening 185. The anode may be connected to the first anode connecting member ACM1 and the transistor through the second anode connecting member ACM2. The anode may be configured with (or defined by) a single layer including a transparent conductive oxide film or a metal material or with a multilayer including them. The transparent conductive oxide film may include an indium tin oxide (ITO), a poly-ITO, an indium zinc oxide (IZO), an indium gallium zinc oxide (IGZO), or an indium tin zinc oxide (ITZO), and the metal material may include silver (Ag), molybdenum (Mo), copper (Cu), gold (Au), or aluminum (Al).

A pixel defining layer 380 may be provided or formed on the anode and the third organic film 183. The pixel defining layer 380 may include or be made of an organic insulating material. The pixel defining layer 380 may be configured with a black pixel defining layer further including a light blocking material. The light blocking material may include a resin or a paste including at least one selected from carbon black, carbon nanotubes, a black dye, a metal particle, for example, nickel, aluminum, molybdenum, and an alloy thereof and a metal oxide particle (e.g., a chromium nitride). The black pixel defining layer 380 may include or be made of an organic material having a negative-type black color. In such an embodiment, as the negative type organic material is used, a portion covered by the mask may be removed.

Openings 381 and 383 may be formed in the pixel defining layer 380. In an embodiment, for example, the third opening 381 may be formed to overlap the anode. The front surface of the anode may be exposed by the third opening 381. The third opening 381 may overlap a center portion of the anode. Therefore, the pixel defining layer 380 may cover an edge of the anode. The fourth opening 383 may be formed to overlap the second opening 187. The front surface of the cathode connecting member 743 may be exposed by the fourth opening 383.

A spacer 385 may be further provided or formed on the pixel defining layer 380. The spacer 385 may have a structure with steps. The spacer 385 may include a first portion 385-1 having a greater height and positioned in a narrow region, and a second portion 385-2 having a lesser height and positioned in a wide region. The first portion 385-1 and the second portion 385-2 may be integrally formed with each other as a single unitary and indivisible part. The spacer 385 may include or be made of a photosensitive polyimide (PSPI).

In an embodiment, as shown in FIG. 20, a photoresist pattern 610 may be provided or formed in the fourth opening 383. The photoresist is formed on the pixel defining layer 380 including the third opening 381 and the fourth opening 383, and a photo process may be performed to leave a portion of the photoresist positioned in the fourth opening 383 and a peripheral portion and remove other portions. The photoresist pattern 610 may have a reverse taper shape. When the photo process is performed, a post-bake process may be omitted or a bake time may be reduced so that the photoresist pattern 610 may have a reverse taper shape. An inclined angle of the lateral side from the bottom side of the photoresist pattern 610 may be about 110 degrees.

A width of the photoresist pattern 610 may be greater than a width of the second opening 187. The width of the photoresist pattern 610 may be greater than a width of the fourth opening 383. A thickness of the photoresist pattern 610 may be greater than thicknesses of the second organic film 182, the third organic film 183, and the pixel defining layer 380. However, without being limited thereto, the width and the thickness of the photoresist pattern 610 may be adjusted depending on cases.

Figure 21:
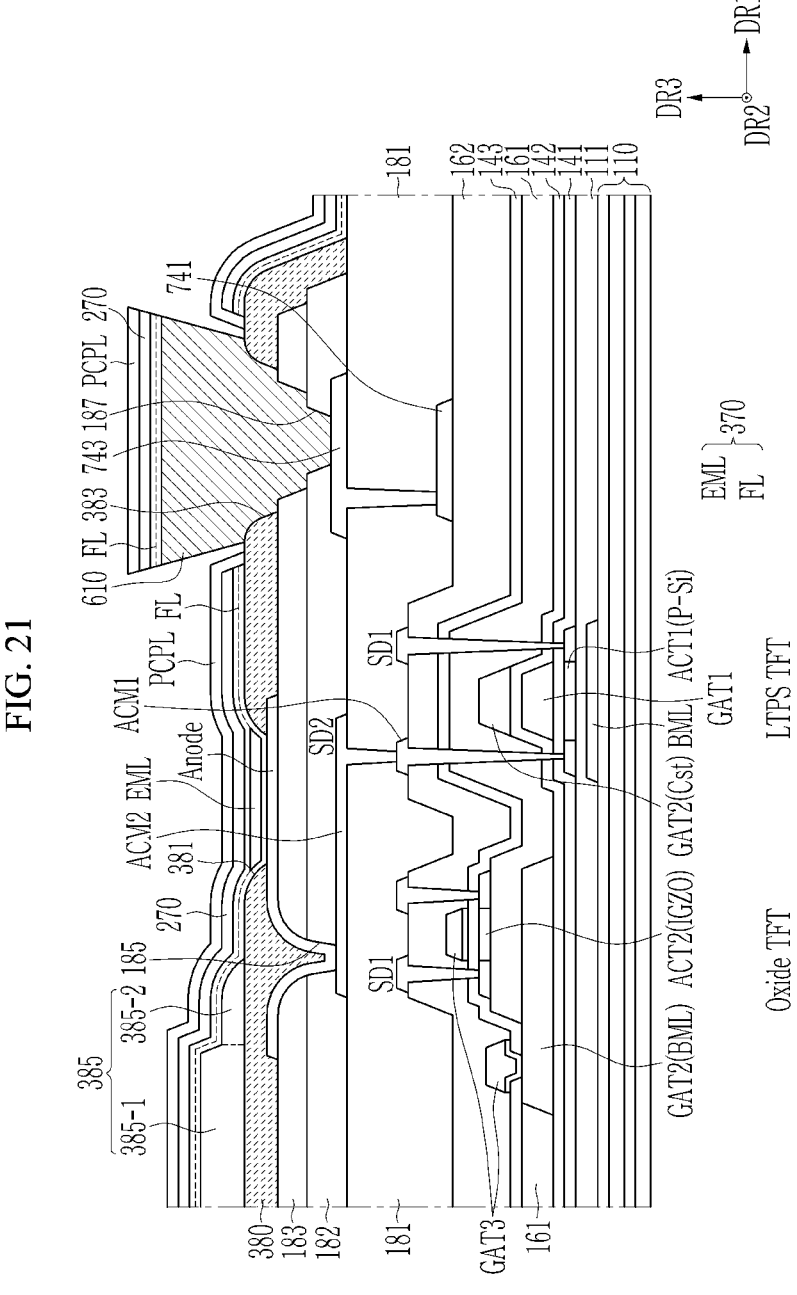

As shown in FIG. 21, an emission layer 370 may be provided or formed on the anode and the photoresist pattern 610. The emission layer 370 may be provided on the substrate 110. The emission layer 370 may include an organic emission layer EML and a functional layer FL.

The organic emission layer EML may not be generally or commonly positioned on the substrate 110. In an embodiment, for example, the organic emission layer EML may be positioned in the third opening 381. The organic emission layer EML may include or be made of an organic light emitting material. In an embodiment, the organic emission layer EML positioned on the adjacent pixel may emit light with different wavelengths from each other. In an alternative embodiment, a color filter overlapping the organic emission layer EML may be further included, and the organic emission layers EML of the respective pixels may emit light with a same wavelength as each other.

The functional layer FL may be generally or commonly provided or formed on the substrate 110. The functional layer FL may include a hole injection layer, a hole transport layer, an electron transport layer, and an electron injection layer, and the functional layer FL may be positioned on an upper portion and a lower portion of the organic emission layer EML. That is, the hole injection layer, the hole transport layer, the organic emission layer EML, the electron transport layer, the electron injection layer, and the cathode 270 may be sequentially positioned on the anode. From among the functional layer FL, the hole injection layer and the hole transport layer may be positioned on the lower portion of the organic emission layer EML, and the electron transport layer and the electron injection layer may be positioned on the upper portion of the organic emission layer EML.

A portion of a cathode 270 is provided or formed on the emission layer 370. This is referred to as a first cathode formation. In the first cathode formation, a material for forming a cathode may be deposited to a thickness of about 50% of a target thickness. The target thickness refers to a thickness of the cathode 270 finally formed on a light emitter (or the organic emission layer EML) of the light emitting display device according to an embodiment.

The cathode 270 may include or be made of a transmissive electrode or a reflective electrode. In embodiments, the cathode 270 may be a transparent or semi-transparent electrode, and may include or be made of a metal thin film with a low work function including at least one selected from lithium (Li), calcium (Ca), lithium fluoride/calcium (LiF/Ca), lithium fluoride/aluminum (LIF/Al), aluminum (Al), silver (Ag), and magnesium (Mg), and a compound thereof. A transparent conductive oxide (TCO) layer such as an indium tin oxide (ITO), an indium zinc oxide (IZO), a zinc oxide (ZnO), or an indium oxide ($In_2O_3$) may be further disposed on the metal thin film. The cathode 270 may be integrally or commonly formed on the front side in the light emitting display device DP.

A temporary capping layer PCPL is provided or formed on the cathode 270. The temporary capping layer PCPL may generally cover the cathode 270. The temporary capping layer PCPL may include an organic insulating material and/or an inorganic insulating material.

The emission layer 370, the cathode 270, and the temporary capping layer PCPL are sequentially stacked, and may be generally or commonly formed on the substrate 110. The emission layer 370, the cathode 270, and the temporary capping layer PCPL are also positioned on the photoresist pattern 610. Portions of respective layers positioned on the photoresist pattern 610 may be separated from portions of respective layers positioned near the photoresist pattern 610 by steps generated by the photoresist pattern 610. That is, a portion of the emission layer 370 overlapping the photoresist pattern 610 in the third direction DR3 is separated from a portion of the emission layer 370 not overlapping the photoresist pattern 610 in the third direction DR3. A portion of the cathode 270 overlapping the photoresist pattern 610 in the third direction DR3 is separated from a cathode 270 not overlapping the photoresist pattern 610 in the third direction DR3. In such an embodiment, a portion of the temporary capping layer PCPL overlapping the photoresist pattern 610 in the third direction DR3 is separated from a portion of the temporary capping layer PCPL not overlapping the photoresist pattern 610 in the third direction DR3.

The temporary capping layer PCPL may cover a lateral side of the cathode 270. The temporary capping layer PCPL may cover a lateral side of the emission layer 370. The temporary capping layer PCPL may prevent the cathode 270 or the emission layer 370 from being damaged in a subsequent process.

Figure 22:
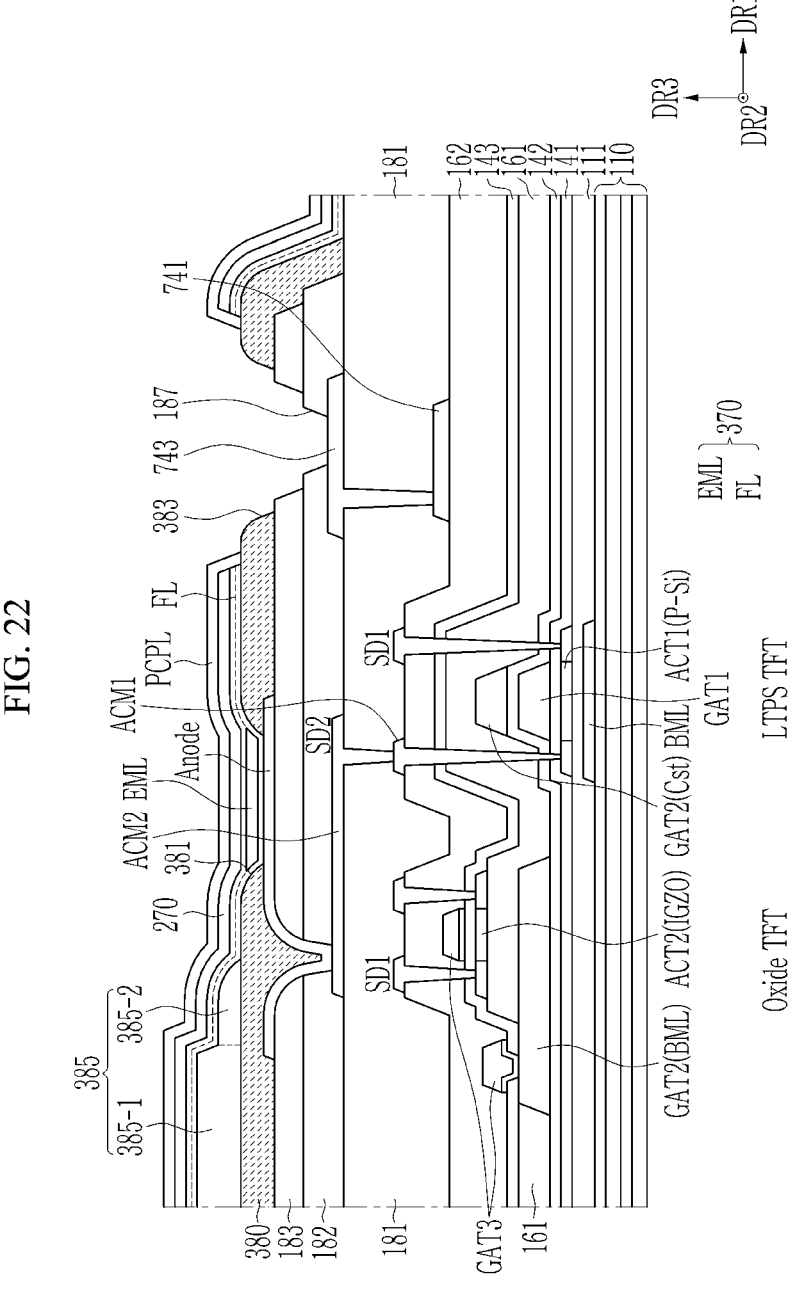

As shown in FIG. 22, the photoresist pattern 610 is removed. In a process for removing the photoresist pattern 610, the layers positioned on the photoresist pattern 610 may be removed. That is, the emission layer 370, the cathode 270, and a portion of the temporary capping layer PCPL positioned on the photoresist pattern 610 may be removed. The emission layer 370, the cathode 270, and a portion of the temporary capping layer PCPL that are not positioned on the photoresist pattern 610 remain. While the process for removing the photoresist pattern 610 is performed, the emission layer 370 and the cathode 270 that are not positioned on the photoresist pattern 610 may be protected by the temporary capping layer PCPL and may not be damaged.

Figure 23:
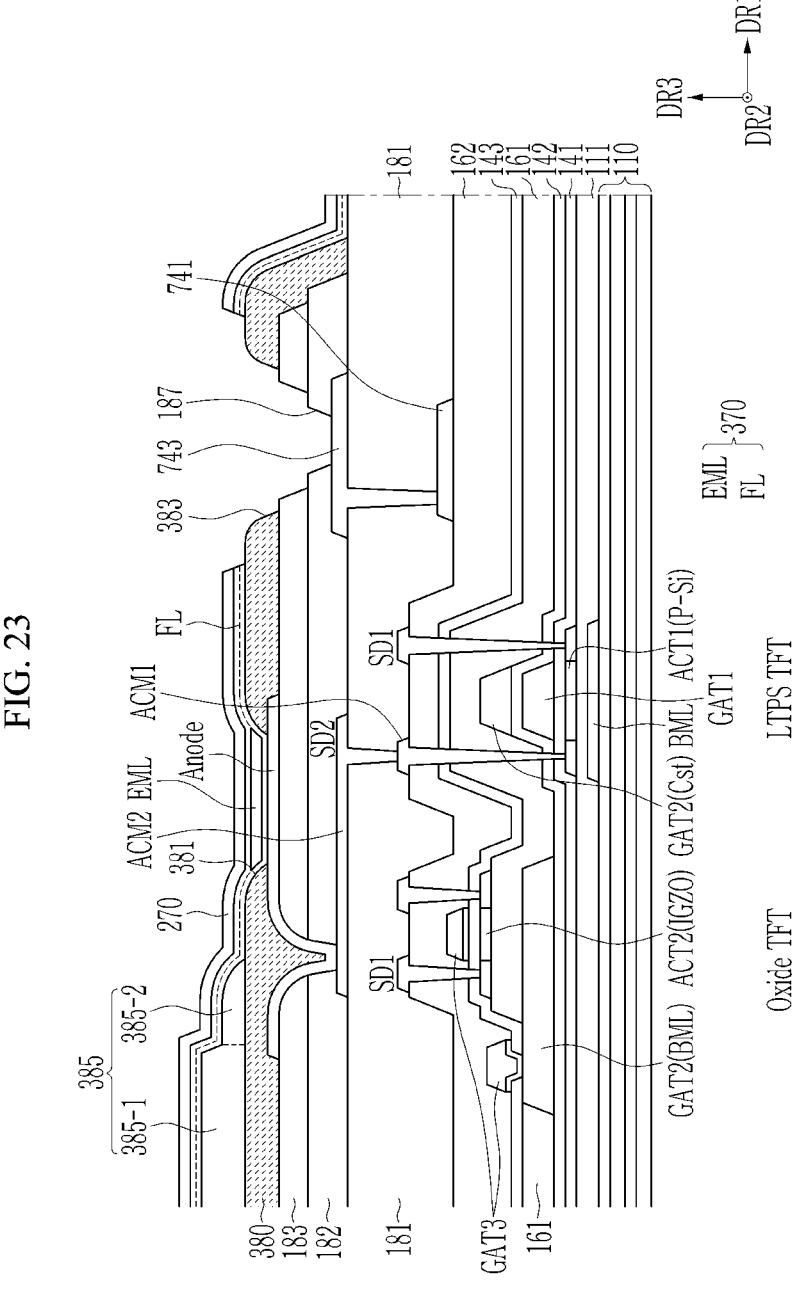

As shown in FIG. 23, the temporary capping layer PCPL is removed. The temporary capping layer PCPL may be removed by a dry etching process. The temporary capping layer PCPL may be generally removed.

Figure 24:
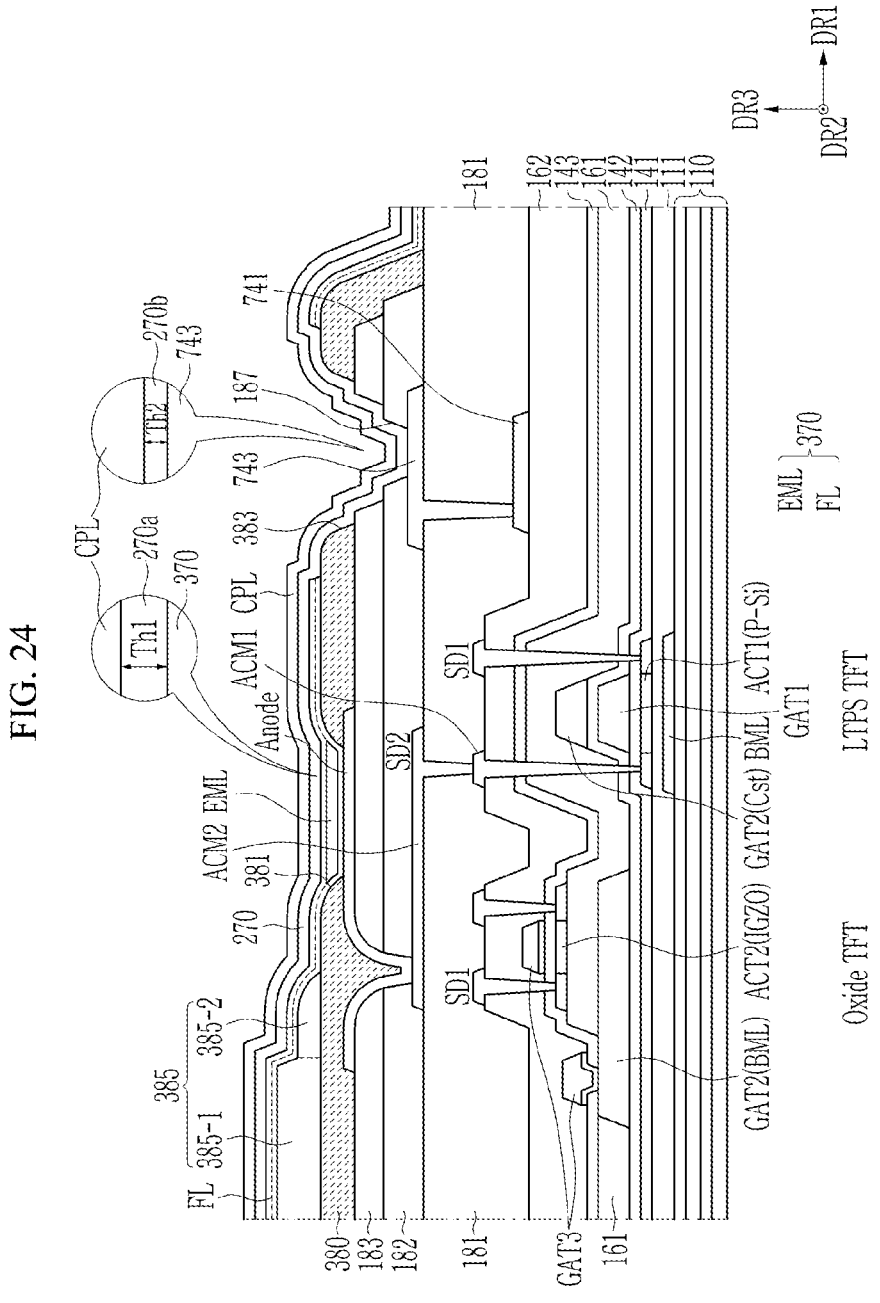

As shown in FIG. 24, another portion of the cathode 270 is additionally provided or formed on the initially formed portion of the cathode 270 and the common voltage line 741. This is referred to as second cathode formation. In the second cathode formation, a material for forming a cathode may be deposited to a thickness of about 50% of a target thickness. Accordingly, a portion of the cathode 270 formed on the light emitter may have a thickness corresponding to the target thickness.

While a portion of the cathode 270 formed in the first cathode formation remains, the cathode 270 is generally additionally formed on the substrate 110 in the second cathode formation. Therefore, the thickness of the cathode 270 may be variable according to the position therein. The cathode 270 may include a first portion 270a overlapping the emission layer 370 and a second portion 270b not overlapping the emission layer 370. The thickness Th1 of the first portion 270a of the cathode 270 may be different from the thickness Th2 of the second portion 270b. The thickness Th1 of the first portion 270a of the cathode 270 may be greater than the thickness Th2 of the second portion 270b of the cathode 270. The thickness Th2 of the second portion 270b of the cathode 270 may be about half the thickness Th1 of the first portion 270a of the cathode 270.

The second portion 270b of the cathode 270 may be positioned in the region in which the photoresist pattern 610 is removed, that is, in the second opening 187 and the fourth opening 383. No emission layer 370 is positioned in the second opening 187 and the fourth opening 383. Hence, the second portion 270b of the cathode 270 may be connected to the cathode connecting member 743 by the second opening 187 and the fourth opening 383. The cathode connecting member 743 may connect between the common voltage line 741 and the cathode 270.

A capping layer CPL is provided or formed on the cathode 270. The capping layer CPL may increase light efficiency by adjusting a refractive index. The capping layer CPL may generally or commonly cover the cathode 270. The capping layer CPL may include an organic insulating material and/or an inorganic insulating material.

Although not shown, an encapsulation layer may be further provided or formed on the capping layer CPL. The encapsulation layer protects the light emitting diode LED from moisture or oxygen that may be input from the outside, and it may include at least one inorganic film and at least one organic film. In an embodiment, for example, the encapsulation layer may have a structure in which a first inorganic encapsulation layer, an organic encapsulation layer, and a second inorganic encapsulation layer are stacked one on another. However, this is an example, and numbers of inorganic films and organic films configuring the encapsulation layer are variously modified.

A light emitting display device and a manufacturing method thereof according to an alternative embodiment will now be described with reference to FIG. 25 to FIG. 31.

Embodiments of the light emitting display device and the manufacturing method thereof to be described with reference to FIG. 25 to FIG. 31 are substantially the same as the embodiments of the light emitting display device and the manufacturing method thereof described above with reference to FIG. 1 to FIG. 24 except that an auxiliary photoresist pattern is formed in the light transmitting region. The same or like elements shown in FIG. 25 to FIG. 31 have been labeled with the same reference characters as used above to describe the embodiments with reference to FIG. 1 to FIG.

24, and any repetitive detailed description thereof will hereinafter be omitted or simplified.

FIG. 25 to FIG. 31 show cross-sectional views of part of a light emitting display device according to an embodiment in manufacturing processes.

Figure 25:
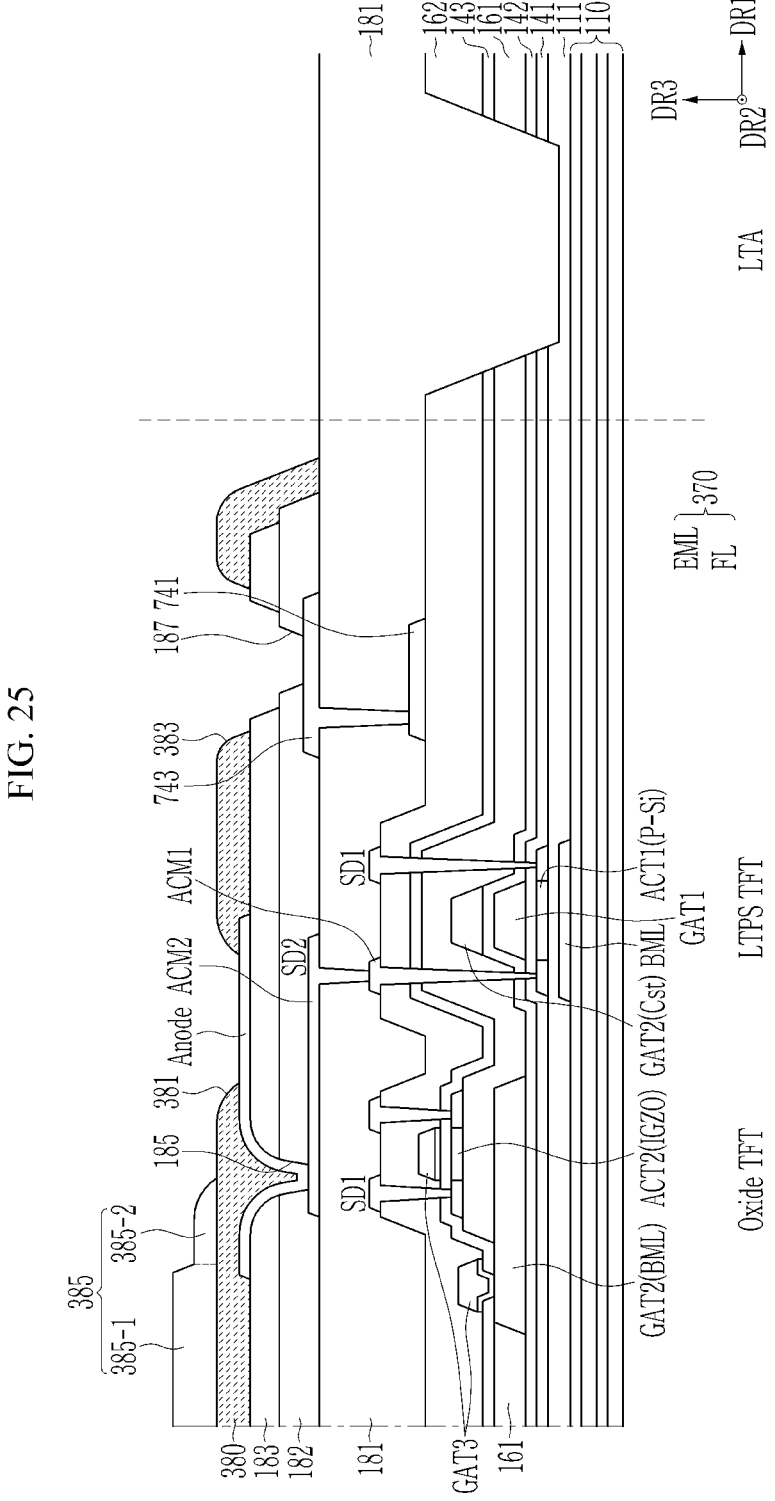

As shown in FIG. 25, the light emitting display device includes a substrate 110 and a plurality of transistors positioned on the substrate 110 as in the embodiments described above. Some of the transistors may include or be made of oxide semiconductor transistors (Oxide TFT), and others may be made of silicon semiconductor transistors (LTPS TFT). An anode may be connected to some of the transistors. The transistors and the anode may be connected to each other by the first anode connecting member ACM1 and the second anode connecting member ACM2. A common voltage line 741 is positioned on the substrate 110, and the cathode connecting member 743 may be connected to the common voltage line 741.

The light emitting display device may include a light transmitting area LTA. A layer including or made of a semiconductor material or a metal material may be removed and transparent materials may be stacked in the light transmitting area LTA so that light may not be blocked but may be transmitted. The transparent material includes an inorganic insulating layer and an organic insulating layer. The inorganic insulating layer or the organic insulating layer may be stacked in the light transmitting area LTA in various ways.

A buffer layer 111 is provided or formed on the substrate 110, and a first organic film 181 is formed on the buffer layer 111 in the light transmitting area LTA of the light emitting display device. The first gate insulating layer 141, the second gate insulating layer 142, the first interlayer insulating layer 161, the third gate insulating layer 143, and the second interlayer insulating layer 162 stacked below the first organic film 181 may be removed from the light transmitting area LTA for the respective pixels. However, without being limited thereto, at least one of the insulating layers may not be removed in some embodiments.

The second organic film 182, the third organic film 183, and the pixel defining layer 380 stacked on the first organic film 181 may be removed from the light transmitting area LTA for the respective pixels. However, without being limited thereto, at least one selected from the second organic film 182, the third organic film 183, and the pixel defining layer 380 may not be removed in some embodiments.

Figure 26:
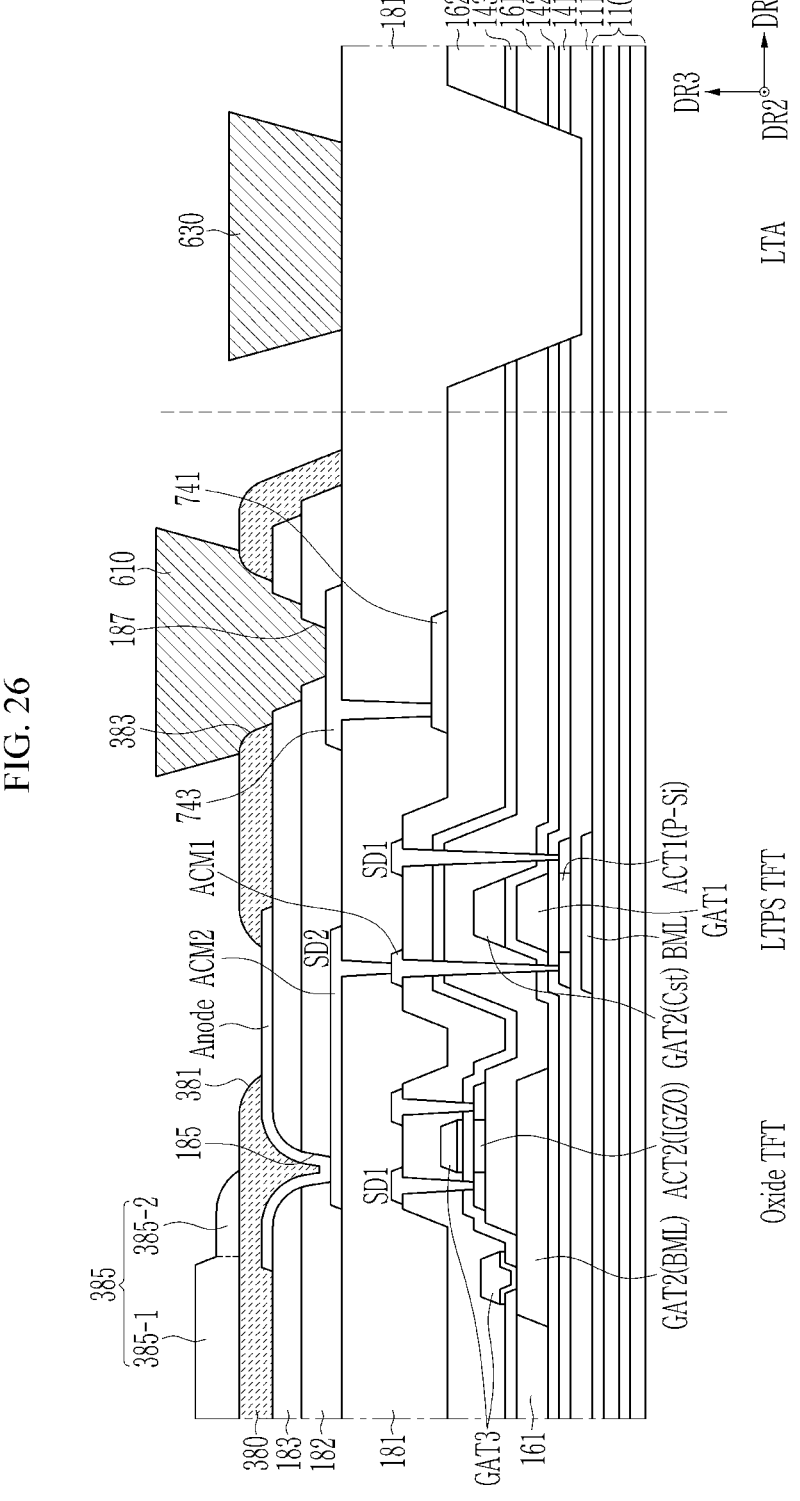

As shown in FIG. 26, a photoresist pattern 610 may be provided or formed in the fourth opening 383, and an auxiliary photoresist pattern 630 may be formed in the light transmitting area LTA. The photoresist pattern 610 and the auxiliary photoresist pattern 630 may be simultaneously formed through a same process. Therefore, the photoresist pattern 610 and the auxiliary photoresist pattern 630 may be positioned in a same layer as each other and may include a same material as each other.

The photoresist pattern 610 and the auxiliary photoresist pattern 630 may have reverse taper shapes. When the photo process is performed, the post-bake process may be omitted or the bake time may be reduced so that the photoresist pattern 610 and the auxiliary photoresist pattern 630 may have reverse taper shapes.

A width of the auxiliary photoresist pattern 630 may be greater than a width of the photoresist pattern 610. A difference between the width of the photoresist pattern 610 and the width of the auxiliary photoresist pattern 630 is shown to be not big, and it may be big in actuality. In an embodiment, for example, a size of the photoresist pattern

610 is less than a size of one pixel. A size of the auxiliary photoresist pattern 630 may be similar to a size of the light transmitting area LTA. The size of the auxiliary photoresist pattern 630 may be less than the size of the light transmitting area LTA. The light transmitting area LTA may have a size that corresponds to a plurality of pixels, for example, several tens to hundreds of pixels. Therefore, the size of the auxiliary photoresist pattern 630 may be further greater than the size of the photoresist pattern 610.

Figure 27:
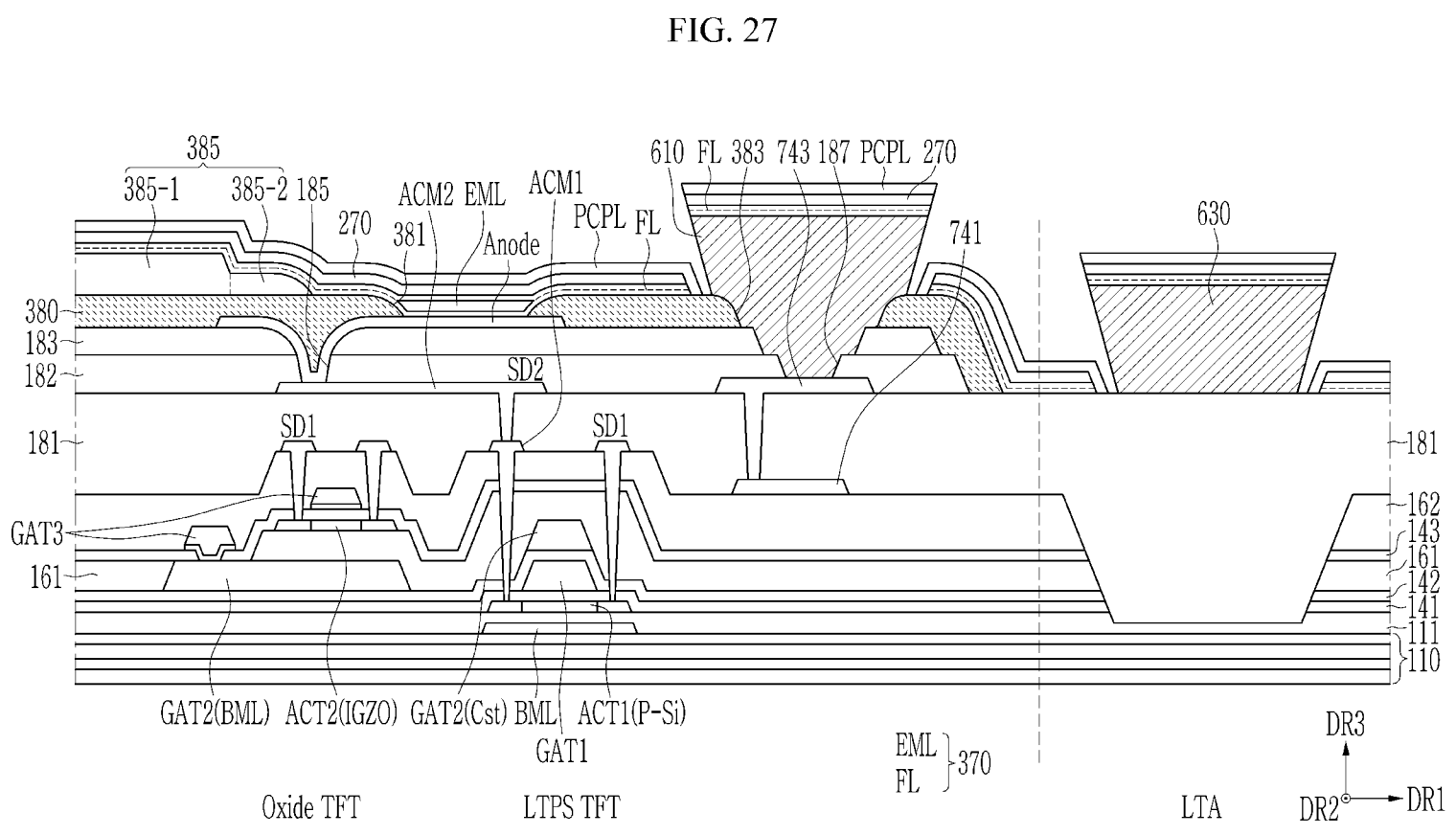

As shown in FIG. 27, an emission layer 370 may be provided or formed on the anode, the photoresist pattern 610, and the auxiliary photoresist pattern 630. The emission layer 370 may be generally or commonly formed on the substrate 110. The emission layer 370 may include an organic emission layer EML and a functional layer FL.

A portion of a cathode 270 is formed on the emission layer 370. This is referred to as first cathode formation. In the first cathode formation, a material for forming a cathode may be deposited to a thickness of about 50% of a target thickness. The target thickness signifies a thickness of the cathode 270 finally formed on a light emitter of the light emitting display device according to an embodiment.

A temporary capping layer PCPL is provided or formed on the cathode 270. The temporary capping layer PCPL may generally cover the cathode 270.

The emission layer 370, the cathode 270, and the temporary capping layer PCPL are sequentially stacked, and may be generally or commonly formed on the substrate 110. The emission layer 370, the cathode 270, and the temporary capping layer PCPL are positioned on the photoresist pattern 610 and the auxiliary photoresist pattern 630. Portions of respective layers positioned on the photoresist pattern 610 may be separated from portions of respective layers positioned near the photoresist pattern 610 by steps generated by the photoresist pattern 610. By the step generated by the auxiliary photoresist pattern 630, portions of the respective layers positioned on the auxiliary photoresist pattern 630 may be separated from portions of the respective layers positioned near the auxiliary photoresist pattern 630. That is, the portion of the emission layer 370 overlapping the auxiliary photoresist pattern 630 in the third direction DR3 is separated from the portion of the emission layer 370 not overlapping the auxiliary photoresist pattern 630 in the third direction DR3. The portion of the cathode 270 overlapping the auxiliary photoresist pattern 630 in the third direction DR3 is separated from the portion of the cathode 270 not overlapping the auxiliary photoresist pattern 630 in the third direction DR3. In such an embodiment, the portion of the temporary capping layer PCPL overlapping the auxiliary photoresist pattern 630 in the third direction DR3 is separated from the portion of the temporary capping layer PCPL not overlapping the auxiliary photoresist pattern 630 in the third direction DR3.

The temporary capping layer PCPL may cover a lateral side of the cathode 270. The temporary capping layer PCPL may cover a lateral side of the emission layer 370. The temporary capping layer PCPL may prevent the cathode 270 or the emission layer 370 from being damaged in a subsequent process.

Figure 28:
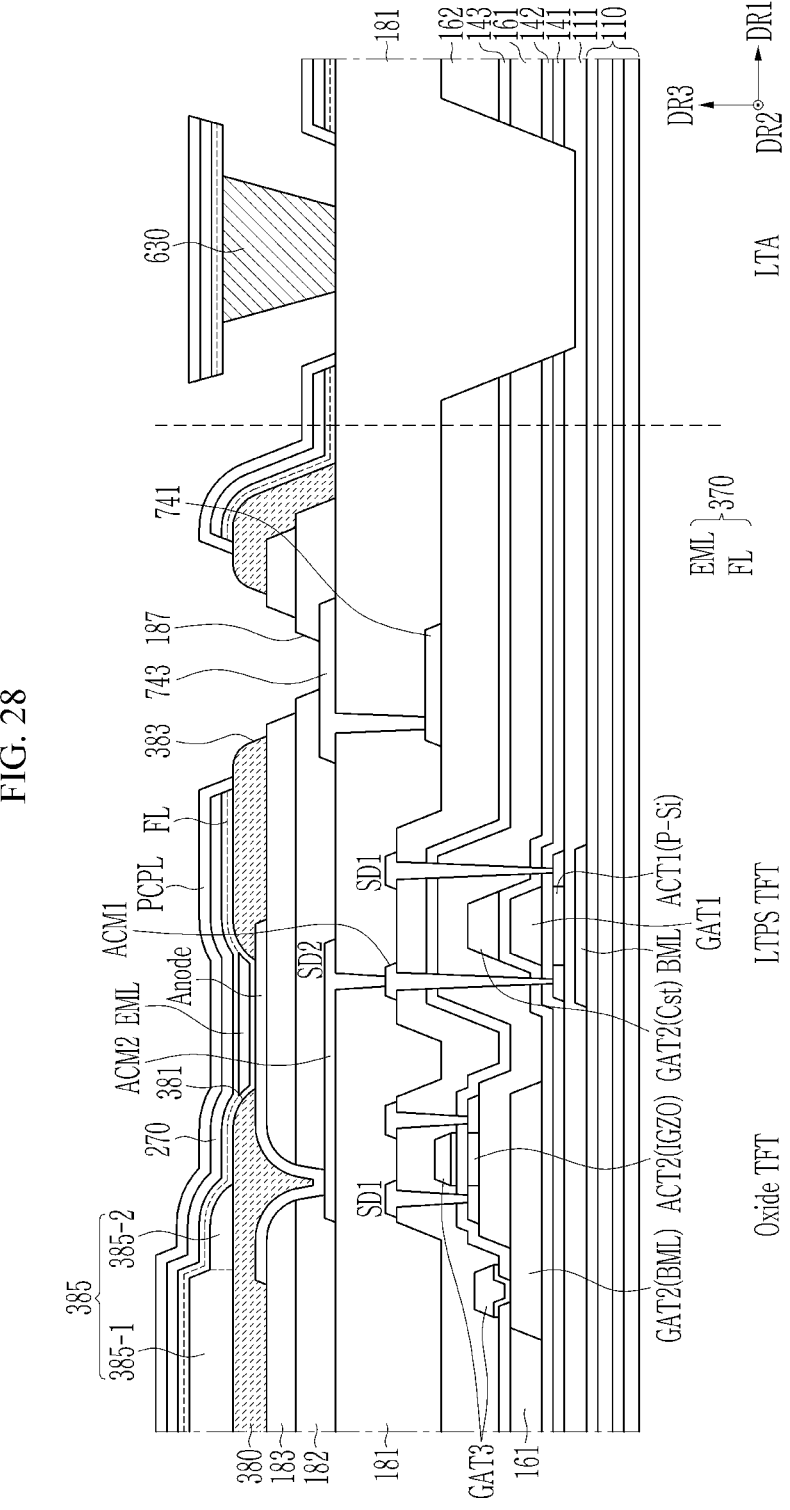

As shown in FIG. 28, the photoresist pattern 610 is removed. In a process for removing the photoresist pattern 610, the layers positioned on the photoresist pattern 610 may be removed. That is, the emission layer 370, the cathode 270, and a portion of the temporary capping layer PCPL positioned on the photoresist pattern 610 may be removed. The emission layer 370, the cathode 270, and a portion of the temporary capping layer PCPL that are not positioned on the photoresist pattern 610 remain. While the process for removing the photoresist pattern 610 is performed, the emission layer 370 and the cathode 270 that are not positioned on the photoresist pattern 610 may be protected by the temporary capping layer PCPL and may not be damaged.

In the process for removing the photoresist pattern 610, the width of the auxiliary photoresist pattern 630 may be reduced. The width of the auxiliary photoresist pattern 630 is greater than the width of the photoresist pattern 610, so when a developing process is performed until the photoresist pattern 610 is removed, some of the auxiliary photoresist pattern 630 remains. That is, the width of the auxiliary photoresist pattern 630 is reduced but not an entire portion thereof is removed. The emission layer 370, the cathode 270, and a portion of the temporary capping layer PCPL positioned on the auxiliary photoresist pattern 630 remain.

Figure 29:
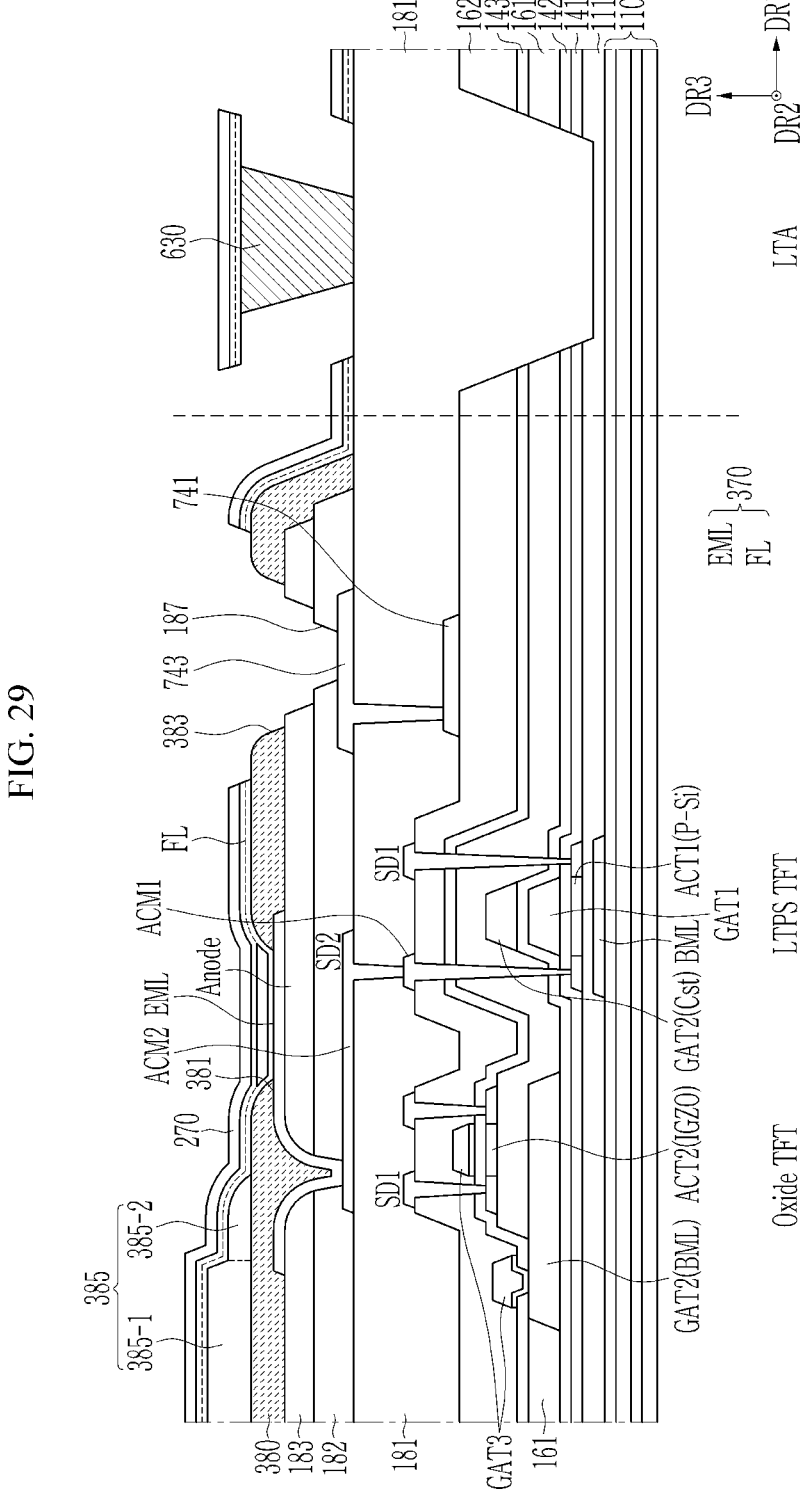

As shown in FIG. 29, the temporary capping layer PCPL is removed. The temporary capping layer PCPL may be removed by a dry etching process. The temporary capping layer PCPL may be generally removed.

Figure 30:
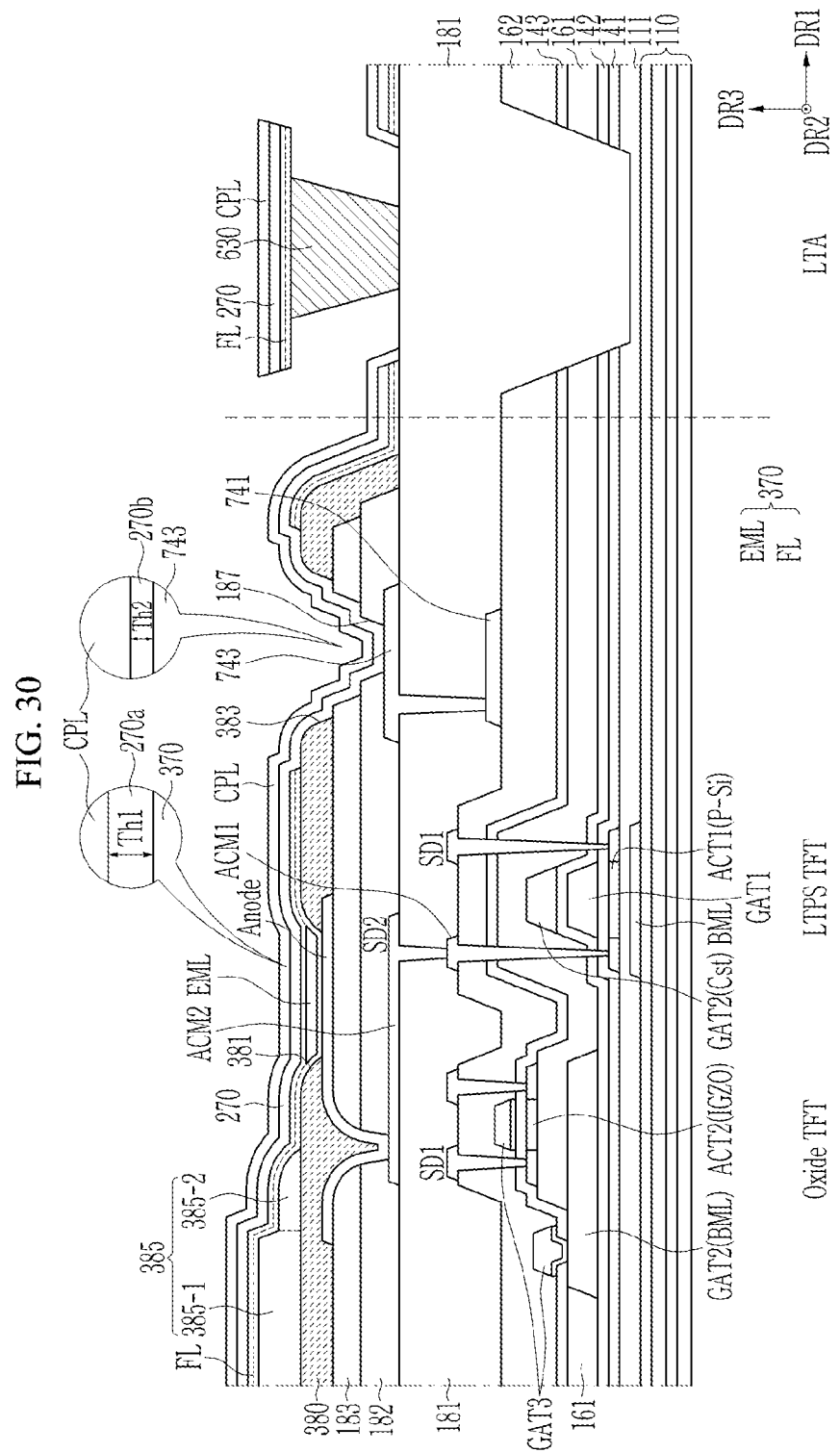

As shown in FIG. 30, a cathode 270 is additionally formed on the cathode 270 and the common voltage line 741. This is referred to as second cathode formation. In the second cathode formation, a material for forming a cathode may be deposited to a thickness of about 50% of a target thickness. Accordingly, a portion of the cathode 270 formed on the light emitter may have a thickness corresponding to the target thickness.

While a portion of the cathode 270 formed in the first cathode formation remains, the cathode 270 is generally additionally formed on the substrate 110 in the second cathode formation. Therefore, the thickness of the cathode 270 may be variable according to the position. The cathode 270 may include a first portion 270a overlapping the emission layer 370 and a second portion 270b not overlapping the emission layer 370. The thickness Th1 of the first portion 270a of the cathode 270 may be different from the thickness Th2 of the second portion 270b. The thickness Th1 of the first portion 270a of the cathode 270 may be greater than the thickness Th2 of the second portion 270b of the cathode 270.

The second portion 270b of the cathode 270 may be positioned in the region in which the photoresist pattern 610 is removed, that is, in the second opening 187 and the fourth opening 383. The second portion 270b of the cathode 270 may be positioned on the auxiliary photoresist pattern 630. No emission layer 370 is positioned in the second opening 187 and the fourth opening 383. Hence, the second portion 270b of the cathode 270 may be connected to the cathode connecting member 743 by the second opening 187 and the fourth opening 383. The cathode connecting member 743 may connect between the common voltage line 741 and the cathode 270.

A capping layer CPL is provided or formed on the cathode 270. The capping layer CPL may increase light efficiency by adjusting a refractive index. The capping layer CPL may generally cover the cathode 270. The capping layer CPL may include an organic insulating material and/or an inorganic insulating material.

The cathode 270 and the capping layer CPL are sequentially stacked, and may be generally formed on the substrate 110. The cathode 270 and the capping layer CPL are also positioned on the auxiliary photoresist pattern 630. By the step generated by the auxiliary photoresist pattern 630, the portions of the respective layers positioned on the auxiliary photoresist pattern 630 may be separated from the portions of the respective layers positioned near the auxiliary photoresist pattern 630. That is, the portion of the cathode 270 overlapping the auxiliary photoresist pattern 630 in the third direction DR3 is separated from the portion of the cathode 270 not overlapping the auxiliary photoresist pattern 630 in the third direction DR3. In such an embodiment, the portion of the capping layer CPL overlapping the auxiliary photoresist pattern 630 in the third direction DR3 is separated from the portion of the capping layer CPL not overlapping the auxiliary photoresist pattern 630 in the third direction DR3.

The capping layer CPL may cover a lateral side of the cathode 270. The capping layer CPL may cover a lateral side of the emission layer 370. The capping layer CPL may prevent the cathode 270 or the emission layer 370 from being damaged in a subsequent process.

Figure 31:
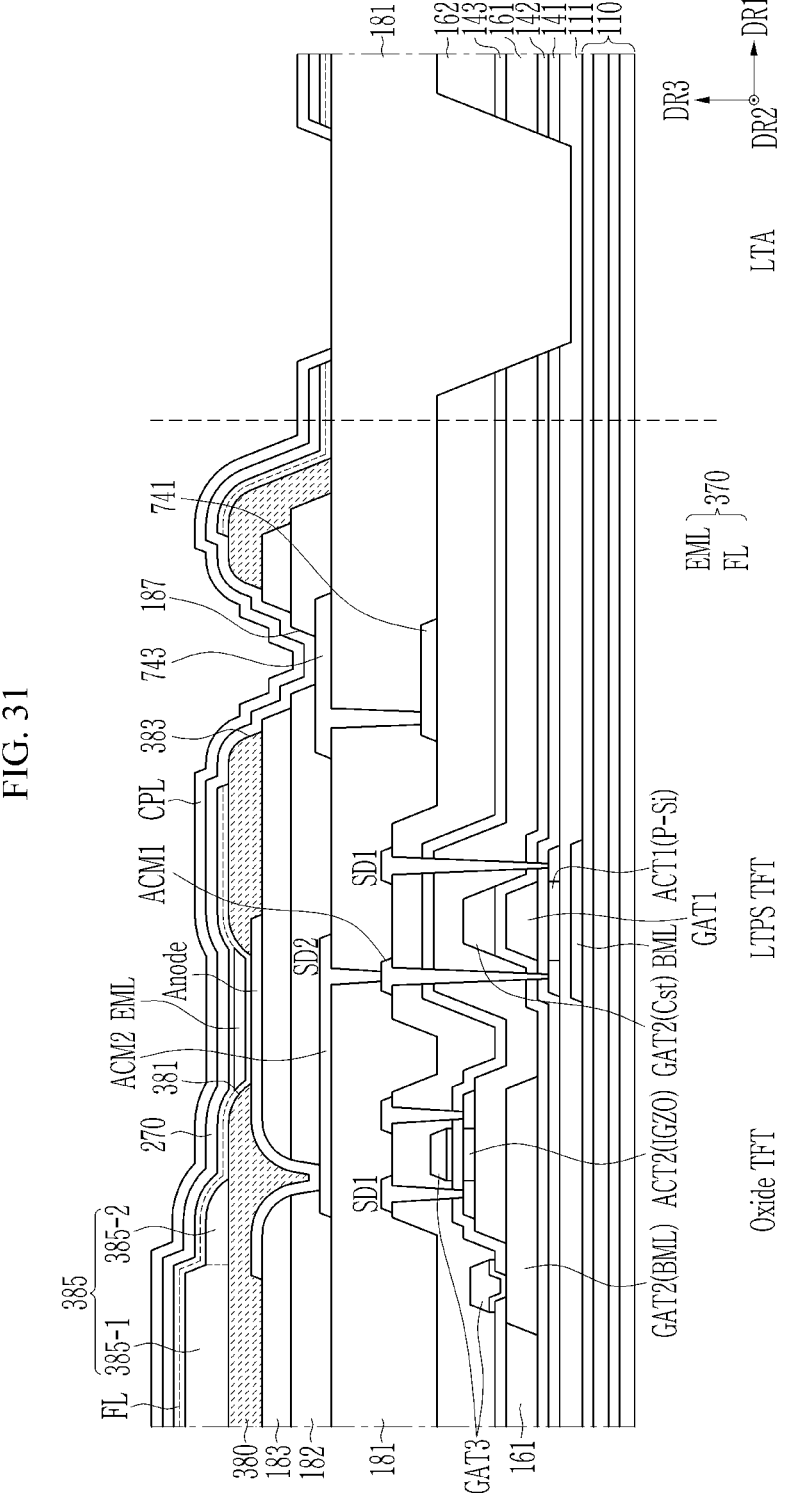

As shown in FIG. 31, the auxiliary photoresist pattern 630 is removed. In a process for removing the auxiliary photoresist pattern 630, the layers positioned on the auxiliary photoresist pattern 630 may be removed. That is, the emission layer 370, the cathode 270, and a portion of the capping layer CPL positioned on the auxiliary photoresist pattern 630 may be removed. Therefore, the emission layer 370, the cathode 270, and the capping layer CPL may not be positioned in the light transmitting area LTA. The emission layer 370, the cathode 270, and a portion of the capping layer CPL that are not positioned on the auxiliary photoresist pattern 630 remain. The emission layer 370, the cathode 270 and a portion of the capping layer CPL may remain in a predetermined region of an edge of the light transmitting area LTA. While the process for removing the auxiliary photoresist pattern 630 is performed, the emission layer 370 and the cathode 270 that are not positioned on the auxiliary photoresist pattern 630 may be protected by the capping layer CPL and may not be damaged.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method for manufacturing a light emitting display device, the method comprising:
providing a transistor on a substrate;
providing a common voltage line on the substrate;
providing an organic film on the transistor and the common voltage line;
forming a first opening and a second opening in the organic film, the first opening overlapping the transistor, the second opening overlapping the common voltage line;
providing an anode in the first opening and on the organic film, the anode connected to the transistor;

providing a pixel defining layer on the anode and the organic film;
forming a third opening and a fourth opening in the pixel defining layer, the third opening overlapping the anode, the fourth opening overlapping the second opening;
providing a photoresist pattern in the fourth opening;
providing an emission layer on the anode and the photoresist pattern;
forming a portion of a cathode on the emission layer by performing a first cathode formation;
removing the photoresist pattern; and
forming another portion of the cathode on the portion of the cathode and the common voltage line by performing a second cathode formation.

2. The method of claim 1, wherein
the photoresist pattern has a reverse taper shape.

3. The method of claim 1, wherein
the removing the photoresist pattern includes removing a portion of the emission layer disposed on the photoresist pattern and the portion of the cathode disposed on the photoresist pattern.

4. The method of claim 3, wherein
a thickness of a first part of the cathode overlapping the emission layer is different from a thickness of a second part of the cathode not overlapping the emission layer.

5. The method of claim 4, wherein
the thickness of the first part of the cathode is greater than the thickness of the second part of the cathode.

6. The method of claim 3, wherein
the emission layer is not disposed in the second opening and the fourth opening.

7. The method of claim 1, further comprising:
providing a temporary capping layer on the cathode after the first cathode formation;
removing the temporary capping layer after the removing the photoresist pattern; and
providing a capping layer on the cathode after the second cathode formation.

8. The method of claim 1, wherein
the substrate includes a light transmitting region,
the providing the photoresist pattern includes providing an auxiliary photoresist pattern in the light transmitting region, and
the auxiliary photoresist pattern has a reverse taper shape.

9. The method of claim 8, wherein
the removing the photoresist pattern includes reducing a width of the auxiliary photoresist pattern.

10. The method of claim 9, further comprising:
removing the auxiliary photoresist pattern after the second cathode formation.

\* \* \* \* \*